United States Patent
Chen et al.

(10) Patent No.: US 11,121,104 B2
(45) Date of Patent: *Sep. 14, 2021

(54) METHOD FOR MANUFACTURING INTERCONNECT STRUCTURE

(71) Applicant: TAIWAN SEMICONDUCTOR MANUFACTURING COMPANY LTD., Hsinchu (TW)

(72) Inventors: Meng-Tse Chen, Pingtung County (TW); Hsiu-Jen Lin, Hsinchu County (TW); Chih-Wei Lin, Hsinchu County (TW); Ming-Da Cheng, Hsinchu County (TW); Chih-Hang Tung, Hsinchu (TW); Chung-Shi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/878,195

(22) Filed: Jan. 23, 2018

(65) Prior Publication Data
US 2018/0151523 A1 May 31, 2018

Related U.S. Application Data

(62) Division of application No. 15/083,085, filed on Mar. 28, 2016, now Pat. No. 9,881,888, which is a division
(Continued)

(51) Int. Cl.
*H01L 21/44* (2006.01)
*H01L 23/00* (2006.01)
(Continued)

(52) U.S. Cl.
CPC .............. *H01L 24/06* (2013.01); *H01L 21/56* (2013.01); *H01L 24/03* (2013.01); *H01L 24/11* (2013.01);
(Continued)

(58) Field of Classification Search
None
See application file for complete search history.

(56) References Cited

U.S. PATENT DOCUMENTS 5,545,927 A * 8/1996 Farooq ................. H01L 23/498
257/762
6,223,432 B1 * 5/2001 Dennison .......... H01L 21/76877
257/E21.585
(Continued)

*Primary Examiner* — Hung K Vu
(74) *Attorney, Agent, or Firm* — WPAT, P.C.; Anthony King

(57) ABSTRACT

A conductive interconnect structure includes a contact pad; a conductive body connected to the contact pad at a first end; and a conductive layer positioned on a second end of the conductive body. The conductive body has a longitudinal direction perpendicular to a surface of the contact pad. The conductive body has an average grain size (a) on a cross sectional plane (Plane A) whose normal is perpendicular to the longitudinal direction of the conductive body. The conductive layer has an average grain size (b) on Plane A. The conductive body and the conductive layer are composed of same material, and the average grain size (a) is greater than the average grain size (b).

18 Claims, 23 Drawing Sheets

Related U.S. Application Data of application No. 14/013,597, filed on Aug. 29, 2013, now Pat. No. 9,331,038.

(51) Int. Cl.
*H01L 25/10* (2006.01)
*H01L 21/56* (2006.01)
*H01L 25/00* (2006.01)

(52) U.S. Cl.
CPC .......... *H01L 24/13* (2013.01); *H01L 25/105* (2013.01); *H01L 25/50* (2013.01); *H01L 2224/0345* (2013.01); *H01L 2224/03462* (2013.01); *H01L 2224/03464* (2013.01); *H01L 2224/0401* (2013.01); *H01L 2224/0558* (2013.01); *H01L 2224/05147* (2013.01); *H01L 2224/05166* (2013.01); *H01L 2224/05666* (2013.01); *H01L 2224/119* (2013.01); *H01L 2224/1134* (2013.01); *H01L 2224/1147* (2013.01); *H01L 2224/11462* (2013.01); *H01L 2224/11464* (2013.01); *H01L 2224/11825* (2013.01); *H01L 2224/11906* (2013.01); *H01L 2224/13005* (2013.01); *H01L 2224/13014* (2013.01); *H01L 2224/13023* (2013.01); *H01L 2224/1357* (2013.01); *H01L 2224/13082* (2013.01); *H01L 2224/13083* (2013.01); *H01L 2224/13147* (2013.01); *H01L 2224/13562* (2013.01); *H01L 2224/13582* (2013.01); *H01L 2224/16058* (2013.01); *H01L 2224/16238* (2013.01); *H01L 2224/16501* (2013.01); *H01L 2224/81193* (2013.01); *H01L 2224/81203* (2013.01); *H01L 2224/81895* (2013.01); *H01L 2225/1058* (2013.01); *H01L 2924/12042* (2013.01); *H01L 2924/181* (2013.01)

(56) References Cited

U.S. PATENT DOCUMENTS

| | | | |
|---|---|---|---|
| 7,189,650 B2 * | 3/2007 | Liu | C25D 3/38 257/E21.175 |
| 7,387,957 B2 * | 6/2008 | Saito | H01L 21/76838 257/E21.575 |
| 7,843,063 B2 * | 11/2010 | Baker-O'Neal | H01L 21/76873 257/751 |
| 8,784,636 B2 * | 7/2014 | Nagai | C25D 5/08 205/148 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,881,888 B2 * | 1/2018 | Chen | H01L 24/13 |
| 2004/0173912 A1 * | 9/2004 | Rhodes | H01L 21/76831 257/774 |
| 2011/0260317 A1 * | 10/2011 | Lu | H01L 24/11 257/737 |
| 2012/0319282 A1 * | 12/2012 | Uzoh | H01L 21/76883 257/763 |

* cited by examiner

METHOD FOR MANUFACTURING INTERCONNECT STRUCTURE

PRIORITY CLAIM AND CROSS-REFERENCE

This application is a divisional of U.S. application Ser. No. 15/083,085, filed Mar. 28, 2016, which is a divisional of U.S. application Ser. No. 14/013,597, filed Aug. 29, 2013.

BACKGROUND

The present disclosure relates to an interconnect structure in a semiconductor packaging.

Three-dimensional (3D) stacked substrate arrangements are electronic devices having a plurality of stacked semiconductor die/chips/wafers that are physically and electrically interconnected with one another. Package on package (PoP) is particularly an integrated circuit packaging method to combine vertically discrete logic through various interconnection structures. Two or more packages are installed atop each other with an interconnection interface to route signals between them. This allows higher component density in devices, such as mobile phones, personal digital assistants (PDA), and digital cameras.

Electrically, PoP offers benefits by minimizing track length between different interoperating parts, such as a controller and a memory. This yields better electrical performance of devices, since shorter routing of interconnections between circuits yields faster signal propagation and reduced noise and cross-talk.

With each generation, as devices operate at lower voltages and higher frequencies, current levels at the die-to-die and/or at the die-to-package interconnection interface are increasing. The maximum allowable current density of widely used solder interconnects is seriously challenged in the ball-grid array (BGA) package setting.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
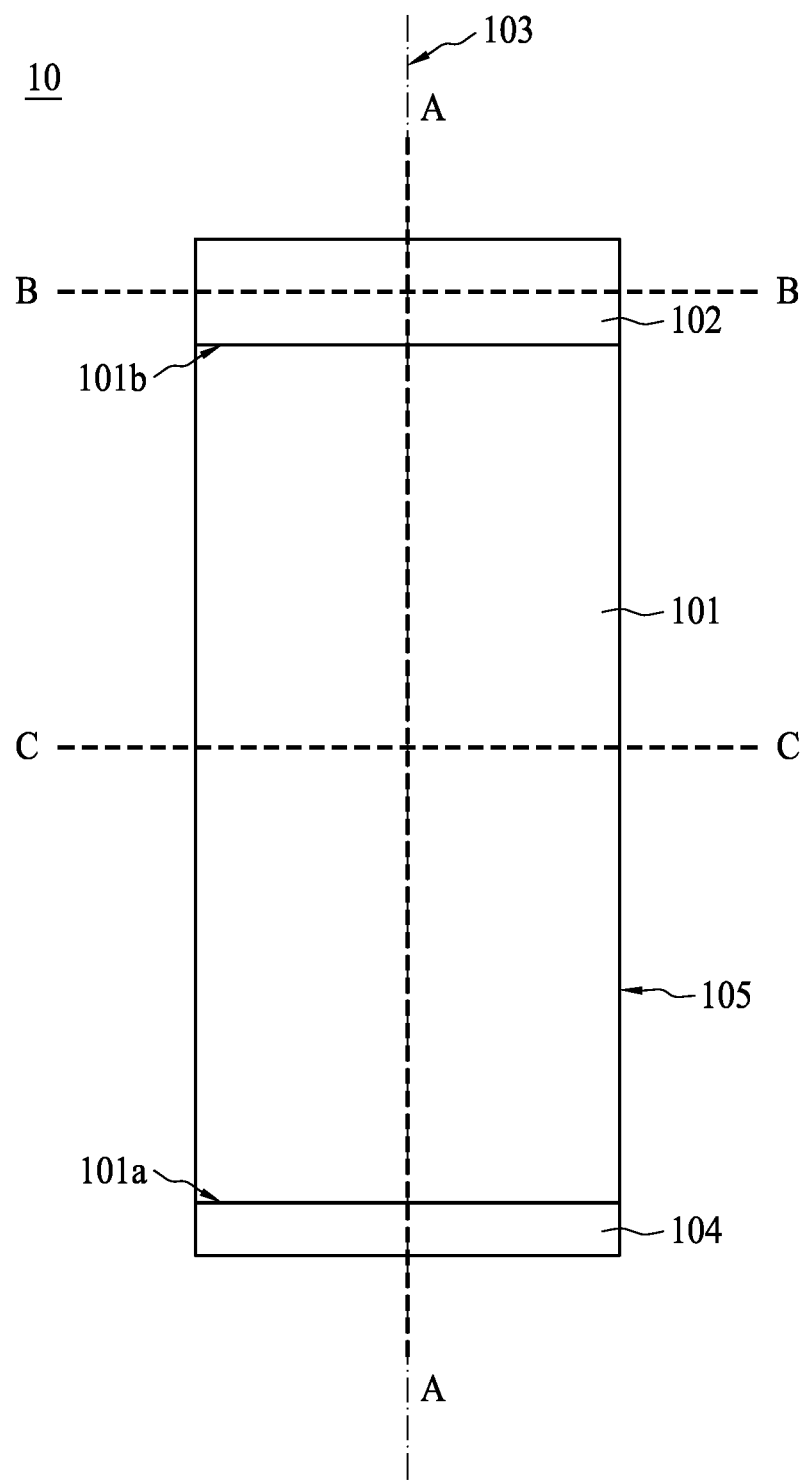
FIG. 1 is a cross sectional view of a free standing conductive interconnect structure according to some embodiments of the present disclosure.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Copper to copper (Cu-to-Cu) direct bonding is an interconnect alternative to the current density-limited BGA. The Cu-to-Cu direct bonding is formed either between the copper wiring on the integrated circuit to the copper wiring on the substrate or between the copper wirings of two individual packages. The Cu-to-Cu direct bonding can provide high conductivity electrical connections, excellent electromigration resistance, and free of brittle intermetallic compounds. The mechanical strength of high aspect ratio Cu-to-Cu bonding can also be tailored so that underfill structure can be omitted.

Copper to copper fusion is usually adopted to achieve Cu-to-Cu direct bonding. The critical parameters of copper to copper fusion include (i) creating intimate contact between the two clean copper surfaces, (ii) the bonding temperature and pressure, and (iii) bonding time. In order to obtain adequate boding between two copper surfaces, high temperature (normally 350-450° C.) annealing under pressure is required. Bonding time can be a limiting factor to the overall through put of the Cu-to-Cu direct bonding. Higher end of the boding temperature is preferred to ensure the quality of the boding interface, however, the temperature desired is too high for cost-effective organic boards or substrates. Therefore, solutions to reduce the Cu-to-Cu direct bonding temperature are continuously sought.

Diffusion is a critical mechanism in achieving Cu-to-Cu direct bonding. Since copper is an FCC metal, the effect of grain boundary diffusion is the dominating mass transport mechanism in a temperature range below 0.8 times of the copper melting temperature. In Cu-to-Cu direct bonding, the effective diffusion coefficient can be described by the following equation:

$$D_{eff}=fD_{gb}+(1-f)D_l \qquad , [\text{Eq. 1}]$$

where $D_{eff}$ is the effective diffusion coefficient, $D_{gb}$ is the grain boundary diffusion coefficient, $D_l$ is the lattice diffusion coefficient, and f is a constant related to grain geometry and grain size. Specifically, f in the equation 1 can be further defined as the following:

$$f=(q/d)\delta \qquad , [\text{Eq. 2}]$$

where the value of q depends on the shape of the grain, d is the average grain size, and δ is the grain boundary width. Considering equations 1 and 2 listed above, in order to achieve a lower bonding temperature, a greater $D_{eff}$ is desired. Small average grain size in a layer with homogeneous grain size distribution is thus preferred at the bonding interface to promote the grain boundary diffusion and the overall diffusion process.

In the present disclosure, some embodiments provide a Cu-to-Cu interconnect structure with a coarser average grain size at the body of one copper post and a finer average grain size at an outer surface of said copper post. A portion of the outer surface of the copper post and another copper surface are then contacted, pressurized, and heated to achieve copper to copper fusion. A method of manufacturing the Cu-to-Cu interconnect structure with a coarse average grain size at the body and a fine average grain size at an outer surface is also disclosed in the present disclosure Definitions In describing and claiming the present disclosure, the following terminology will be used in accordance with the definitions set forth below.

As used herein, an "average grain size" is measured by any conventional grain size measurement techniques such as X-ray diffraction (XRD), electron beam scattering pattern (EBSP), transmission electron microscopy (TEM), or scanning electron microscopy (SEM). A pretreated cross sectional plane of the sample is prepared for any of the above measurements. FIG. 1 shows a free standing interconnect structure 10 with a conductive body 101 and a conductive layer 102 positioned on a top surface of the conductive body 101. A contact pad 104 is positioned at the bottom of the conductive body 101. A longitudinal direction 103 of the interconnect structure 10 is marked by dotted lines. The longitudinal direction refers to the direction parallel to the greatest dimension of the structure. In some embodiments, the cross sectional planes subjected to any of the above measurements is (1) any planes passing through the interconnect structure 10 having a plane normal perpendicular to the longitudinal direction 103, and (2) any planes passing through the interconnect structure 10 having a plane normal parallel to the longitudinal direction 103.

As used herein, an "electron beam scattering pattern (EBSP)" used for average grain size measurement is aided by a computer analysis program (for example, TSL OIM analysis). The setting of the computer analysis program includes, but not limited to, grain boundary misorientation of 15 degrees, CI value equal to or greater than 0.1, and minimal grain size of at least 5 testing points. In some embodiments, The average grain size of the EBSP measurement is obtained by averaging the grain sizes at least on three different testing locations of the cross sectional plane. A predetermined area is measured in each testing location. The predetermined area varies in accordance with features of different embodiments. Each testing location is at least 1 mm away from the adjacent testing location. In some embodiments, the interval between each measuring points in one testing location is at least 5 μm. In some embodiments, the prepared sample subjected to the EBSP measurement is observed under an accelerating voltage of 20 kV and a magnification of 100× to 500λ. In some embodiments, the prepared sample is positioned at a tilting angle of 70 degrees.

As used herein, transmission electron microscopy (TEM), or scanning electron microscopy (SEM)" used for average grain size measurement is aided by an image analysis program (for example, CLEMEX Vision PE). In some embodiments, The average grain size of the TEM or SEM measurement is obtained by averaging the grain sizes at least on three different testing locations of the cross sectional plane. A predetermined area is measured in each testing location. The predetermined area varies in accordance with features of different embodiments. Each testing location is at least 1 mm away from the adjacent testing location. In some embodiments, the interval between each measuring points in one testing location is at least 5 μm. In some embodiments, the prepared sample subjected to the TEM or SEM measurement is observed under an accelerating voltage of 20 kV and a magnification of 100× to 500λ.

As used herein, a "pretreatment" for the cross sectional plane of the sample subjected to average grain size measurement includes a grain boundary etching operation. In some embodiments, the following etching conditions for the grain boundary etching operation is applied: diluted phosphoric acid as the electrolytic solution, current density 0.1 mA/cm², etching time 30 s, and temperature 25° C. In certain embodiments, the etching rate to the grain boundary is 10 times faster than that to the grain itself, and hence the pretreatment facilitates the appearance of the grain feature.

As used herein, a "seed layer" refers to a thin layer deposited prior to a formation of a much thicker layer. In certain embodiments, the seed layer includes Cu or Cu/Ti, and the thickness of which is around 10 nm. The method of seed layer formation includes, but not limited to, electroplating, electroless plating, physical vapor deposition, chemical vapor deposition, or the combination thereof.

As used herein, a "barrier layer" refers to a thin layer deposited between an underlying carrier and a seed layer. The barrier layer promotes the adhesion strength between the underlying carrier and the thicker conductive layer subsequently formed on the seed layer. In some embodiments, the barrier layer is TaN, Ta, TaSiN, TiN, or the combination thereof, and the thickness of which is around 10 nm. The method of barrier layer formation includes, but not limited to, electroplating, electroless plating, physical vapor deposition, chemical vapor deposition, or the combination thereof.

As used herein, a "semiconductor package" refers to building block packages in an advance 3D packaging scheme, which includes, but not limited to, stacked dies using wire bonding and/or flip chip bonding as a means of electrical connection; 3D chip integration with through silicon via (TSV), and said integration directs to different fashions such as wafer-to-wafer, chip-to-wafer, and chip-to-chip; stacked packages such as package-to-package or package-in-package.

As used herein, "vapor deposition" refers to operations of depositing materials on a substrate using a vapor phase of a material to be deposited or a precursor of the material. Vapor deposition operations include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, "molding compound" refers to a compound formed with composite materials. A molding compound may include epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

As used herein, a "conductive post" refers to a conductive filled via or a conductive plug that is disposed on a carrier, a substrate, or embedded in a molding compound. The conductive filled via or a conductive plug is arranged to extend to a top surface of the package or the molding compound. Conductive posts may provide an electrical communication between a top surface and a bottom surface of the package or provide an electrical communication between a top surface of the package to a die in the package.

As used herein, a "contact pad" is disposed on a surface of a die or a substrate. A surface of the contact pad may receive a solder ball, a solder paste, or a conductive post to act as a terminal to electrically connect the die to an external circuit or to an RDL. The opposite surface of the contact pad is either connected to an RDL, or to an active area in the die. In some embodiments, the contact pad is an under bump metallization (UBM). In some embodiments, the UBM is formed with a conductive material such as gold, silver, copper, nickel, tungsten, aluminum, and/or alloys thereof.

As used herein, a "mask layer" or a "cover layer" is used in the present disclosure to be an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operation. The mask layer or a cover layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, "filling" or "filled" is used in the present disclosure to describe an operation of forming material in a hole. The filling operation includes various steps and operations and varies in accordance with features of embodiments. In some embodiments, a filling operation includes forming a conductive material in a hole. In some embodiments, a filling operation includes an electroplating operation. In some embodiments, a filling operation includes a vapor deposition operation.

The problems and needs outlined above are addressed by embodiments of the present disclosure. FIG. 1 is a free standing interconnect structure 10 with a conductive body 101 and a conductive layer 102 positioned at a second end 101b of the conductive body 101. A contact pad 104 is positioned at a first end 101a that is opposite to the second end 101b of the conductive body 101. In some embodiments, the contact pad 104 is disposed on a carrier (not shown) of a semiconductor package. A seed layer and a barrier layer (not shown) are positioned between the contact pad 104 and the conductive body 101 to promote the adhesion among the two. In some embodiments, the conductive body 101 is a conductive copper post, and the conductive layer 102 is a conductive copper layer.

A longitudinal direction 103 of the interconnect structure 10 is marked by dotted lines. The longitudinal direction refers to the direction parallel to the greatest dimension of the structure. As shown in FIG. 1, the greatest dimension of the interconnect structure 10 is along the sidewall 105 of the conductive body 101. FIG. 1 shows three dissecting directions that lead to three cross sectional planes of different microstructures.

The first dissecting direction passes through line AA and follows the longitudinal direction 103 of the conductive body 101. The normal of the resulting cross sectional plane is perpendicular to the longitudinal direction 103 of the conductive body 101. Said cross sectional plane is denoted as A plane hereinafter. The second dissecting direction passes through line BB and follows the direction perpendicular to the longitudinal direction 103 of the conductive body 101. The normal of the resulting cross sectional plane is parallel to the longitudinal direction 103 of the conductive body 101. Said cross sectional plane is denoted as B plane hereinafter. The third dissecting direction passes through line CC and follows the direction perpendicular to the longitudinal direction 103 of the conductive body 101. The normal of the resulting cross sectional plane is parallel to the longitudinal direction 103 of the conductive body 101. Said cross sectional plane is denoted as C plane hereinafter. Note in FIG. 1, the B plane and the C plane are parallel to each other but they traverse different portion of the interconnect structure 10. The B plane traverses the conductive layer 102 whereas the C plane traverses the conductive body 101 of the interconnect structure 10.

Figure 2A:
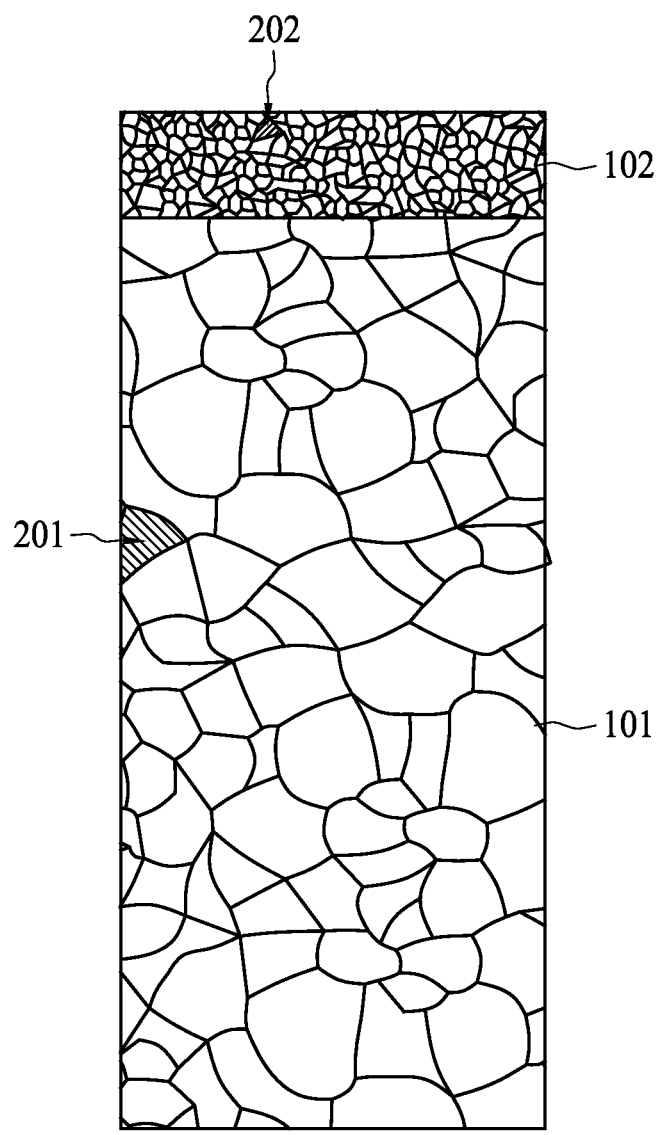
FIG. 2A is the microstructure of the cross sectional plane (Plane A) corresponding to the AA sectioning direction in FIG. 1.
Figure 2C:
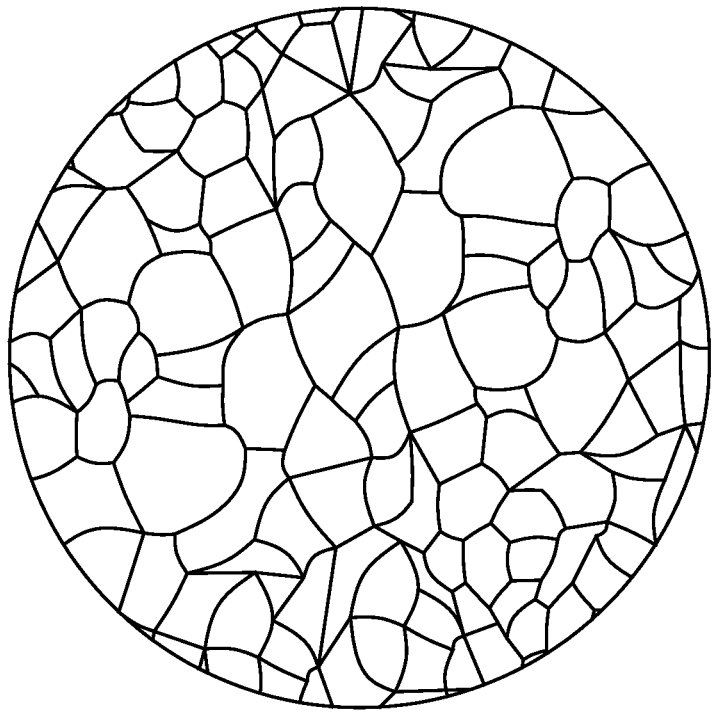
FIG. 2C is the microstructures of the cross sectional plane (Plane C) corresponding to the CC sectioning direction in FIG. 1.
Figure 2B:
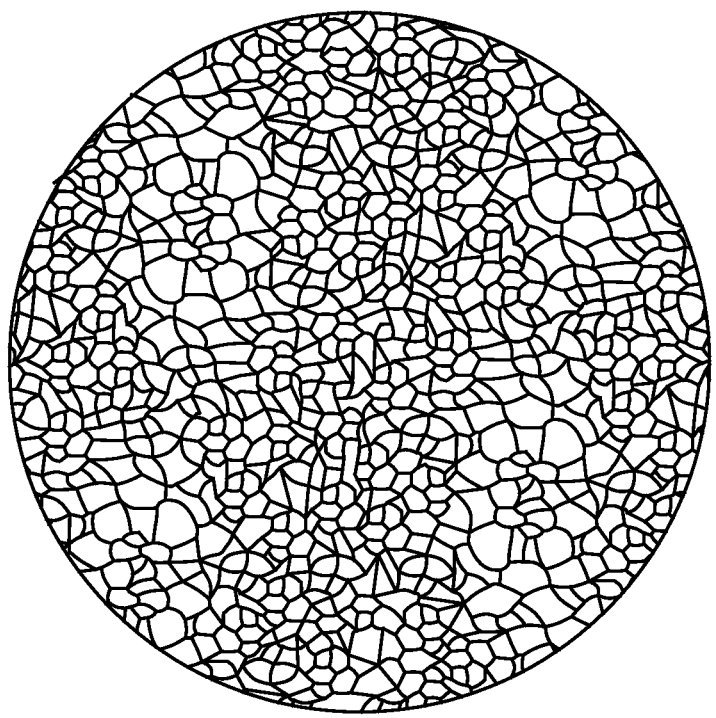
FIG. 2B is the microstructures of the cross sectional plane (Plane B) corresponding to the BB sectioning direction in FIG. 1.

FIG. 2A to FIG. 2C are the illustrations of the microstructures in the pretreated A, B, and C planes, respectively. When inspected under an electron microscope, grain structures on the pretreated A, B, C planes are easily visualized. Among the three planes, A plane demonstrates a clear grain size difference between the grains in the conductive body 101 and the grains in the conductive layer 102. In FIG. 2A, a grain 201 in the conductive body 101 and a grain 202 in the conductive layer 102 are marked with shaded lines. In some embodiments, an average grain size (a) is measured from the conductive body 101 of the interconnect structure 10 on the A plane. An average grain size (b) is measured from the conductive layer 102 of the interconnect structure 10 on the A plane. In some embodiments, the average grain size (a) in the A plane is greater than the average grain size (b) in the A plane. The average grain size measurement is discussed in detail with reference to the Definition "average grain size" herein. In certain embodiments, the average grain size (a) in the A plane is 1.5 times greater than the average grain size (b) in the A plane.

B plane shown in FIG. 2B possesses a homogeneous polycrystalline film substantially throughout the area of the B plane. In some embodiments, the grain size is uniformly distributed with a standard deviation less than 0.45. C plane shown in FIG. 2C possesses a homogeneous polycrystalline film substantially throughout the area of the C plane. In certain embodiments, the average grain size (d) of the B plane is close to, but not substantially the same as the average grain size (b) of the A plane. In other embodiments, the average grain size (e) of the C plane is close to, but not substantially the same as the average grain size (a) of the A plane. In certain embodiments, the average grain size (d) of the B plane is smaller than the average grain size (e) of the C plane.

Figure 3:
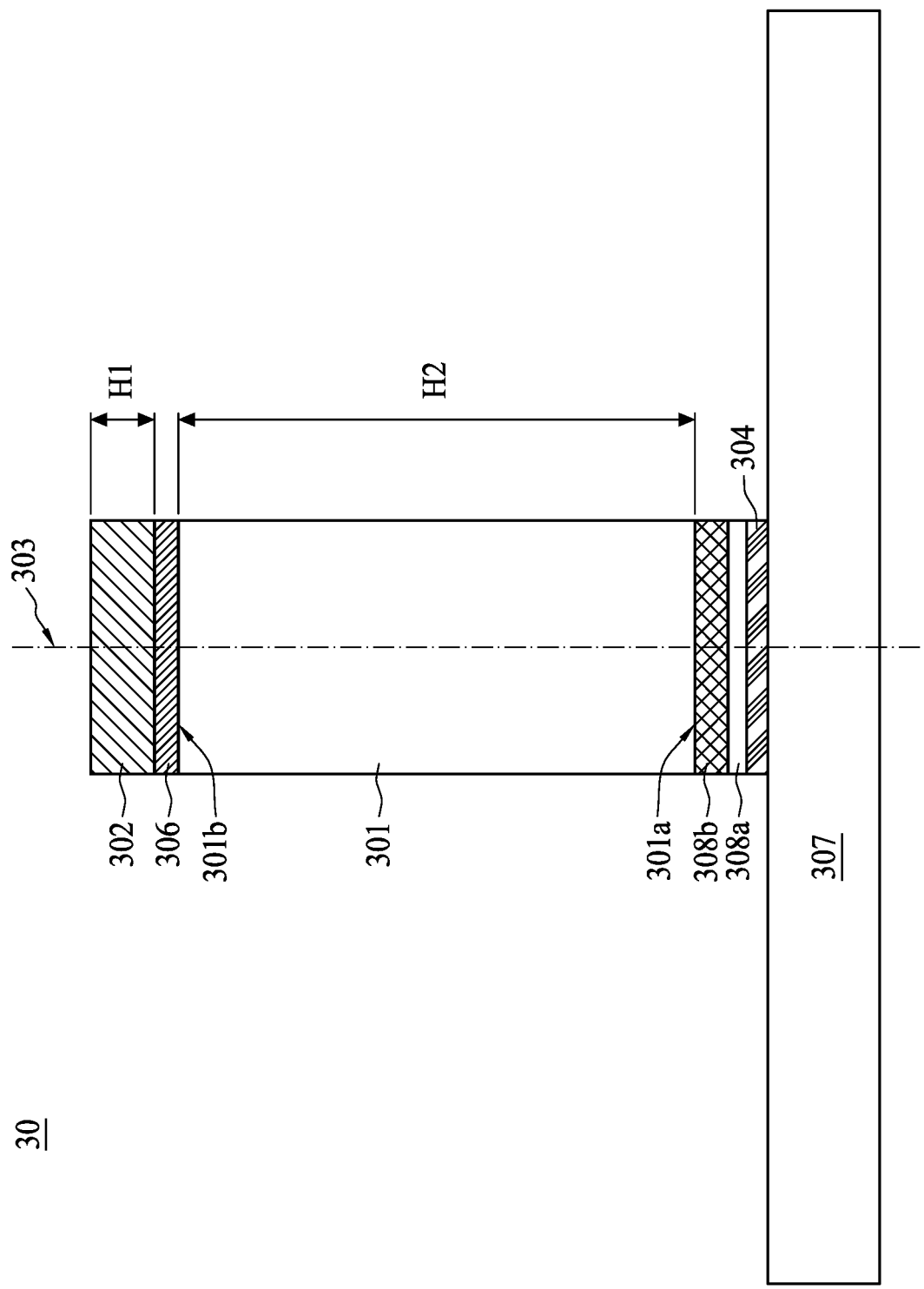
FIG. 3 is a cross sectional view of a conductive interconnect structure according to some embodiments of the present disclosure.

FIG. 3 is an interconnect structure 30 with a conductive body 301 and a conductive layer 302 positioned at a second end 301b of the conductive body 301. A contact pad 304 is positioned at a first end 301a that is opposite to the second end 301b of the conductive body 301. In some embodiments, the contact pad 304 is disposed on a carrier 307 of a semiconductor package. A barrier layer 308a and a seed layer 308b are positioned between the contact pad 304 and the conductive body 301 to promote the adhesion between the contact pad 304 and the conductive body 301. In some embodiments, the conductive body 301 is a conductive copper post, and the conductive layer 302 is a conductive copper layer.

In some embodiments, the conductive layer 302 is subject to direct bonding with another conductive surface (not shown). In some embodiments, the conductive layer 302 is a conductive copper layer with an average grain size (b) below 200 nm, and the conductive body 301 is a conductive copper post with an average grain size (a) between 200 nm and 800 nm. The conductive layer 302 in said embodiment is directly bonded to another conductive copper layer (not shown) positioned on a conductive copper post of another semiconductor package (not shown).

In certain embodiments, as shown in FIG. 3, in addition to the seed layer 308b in proximity to the first end 301a of the conductive body 301, another seed layer 306 is positioned in proximity to the second end 301b of the conductive body 301. When depositing thin films, the grain size and the texture of an upper layer can be affected by the roughness and the texture of an underlying layer. For example, the upper layer deposited shows a strong texture in a specific orientation aligning with the texture of the underlying layer. For another example, the greater the surface roughness of the underlying layer, the smaller the average grain size of the upper layer deposited. In FIG. 3, in order to obtain a smaller average grain size (b) in the conductive layer 302 compared to the average grain size (a) in the conductive body 301, a seed layer 306 is positioned between the two layers to facilitate the average grain size control in the conductive layer 302.

As show in FIG. 3 the height of the conductive layer 302 in the longitudinal direction 303 is denoted as H1, and the height of the conductive body 301 in the longitudinal direction 303 is denoted as H2. The height H1 is at least greater than the interdiffusion length of the conductive layer 302 while subjecting to a pressurized and heated direct bonding operation. In some embodiments, the height H1 is smaller than the height H2. In some embodiments, the height H1 is around 5 nm whereas the height H2 is around 500 nm. In some embodiments, the height H1 is around 50 nm whereas the height H2 is around 0.8 μm. In some embodiments, the height H1 is around 1 μm whereas the height H2 is around 2 μm. However, in some embodiments, the height H1 is equal to or greater than the height H2. In some embodiments, the height H1 is around 5 μm whereas the height H2 is around 5 μm. In some embodiments, the height H1 is around 10 μm whereas the height H2 is around 8 μm.

Figure 4B:
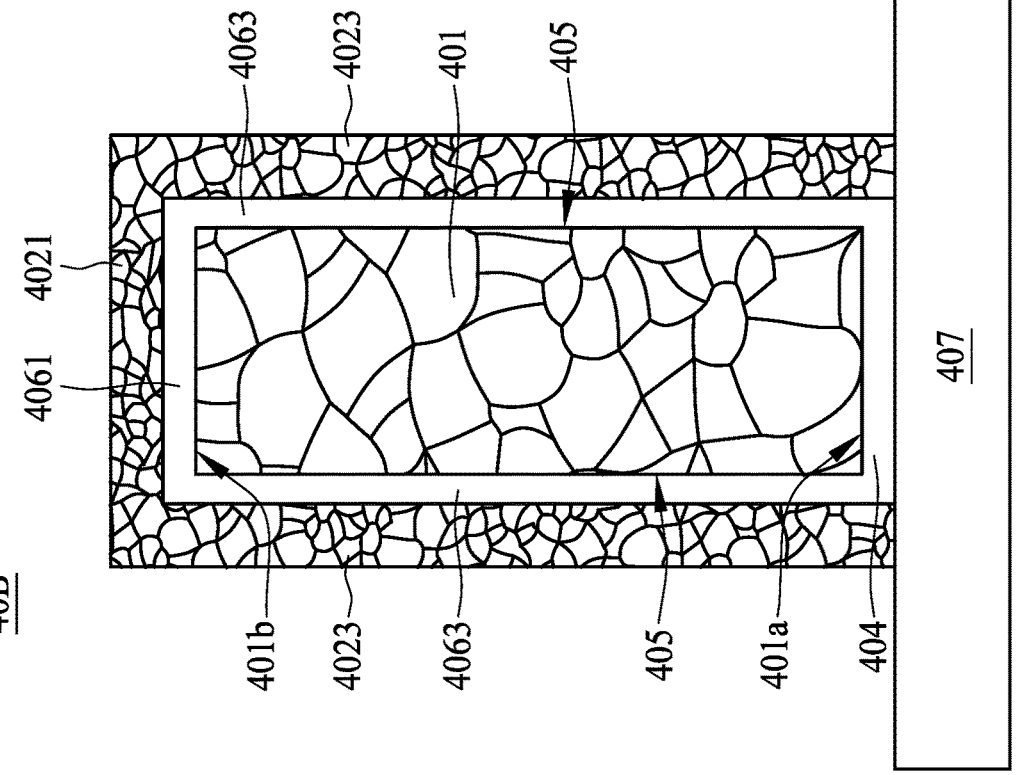
FIG. 4A and FIG. 4B are the microstructures of the cross sectional planes (Plane A) corresponding to the AA sectioning direction in FIG. 1, according to some embodiments of the present disclosure.
Figure 4A:
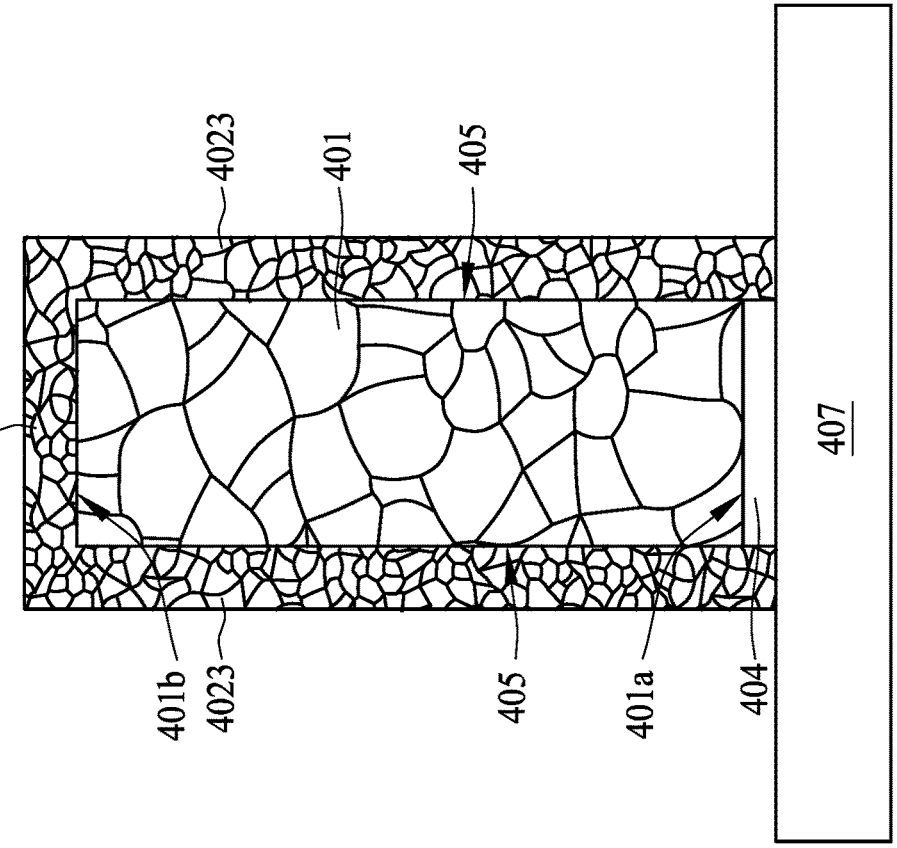

FIG. 4A and FIG. 4B are the microstructures in the A plane of some embodiments of the present disclosure. In FIG. 4A, a carrier 407 is positioned in proximity to a first end 401a of the interconnect structure 40A. A conductive body 401 is disposed on a contact pad 404. The conductive body 401 has a sidewall 405 as shown in FIG. 4A. The microstructure of the carrier 407 and the contact pad 404 are not shown in FIG. 4A. In some embodiments, the conductive body 401 is a cylindrical pillar, and hence the sidewall 405 of the conductive body 401 is a continuous surface. A conductive layer 4021 is disposed at a second end 401b of the conductive body 401, and a conductive layer 4023 is disposed at the sidewall 405 of the conductive body 401. In some embodiments, the average grain size (b) in the conductive layer 4021 is substantially the same as the average grain size (b) in the conductive layer 4023.

In some embodiments, the average grain size (a) in the conductive body 401 is 5 times larger than the average grain size (b) in the conductive layer (4021, 4023). In some embodiments, the difference between the average grain size (a) and the average grain size (b) is 80 nm.

In FIG. 4B, a carrier 407 is positioned in proximity to a first end 401a of an interconnect structure 40B. A conductive body 401 is disposed on a contact pad 404. The conductive body 401 has a sidewall 405 as shown in FIG. 4B. In some embodiments, the conductive body 401 is a quadrangular prism, and hence the sidewall 405 of the conductive body 401 is a continuous surface. A conductive layer 4021 is disposed at a second end 401b of the conductive body 401, and a conductive layer 4023 is disposed at the sidewall 405 of the conductive body 401. In some embodiments, the average grain size (b) in the conductive layer 4021 is substantially the same as the average grain size (b) in the conductive layer 4023.

In FIG. 4B, a seed layer 4061 is disposed in proximity to the first end 401b of the conductive body 401, and a seed layer 4063 is disposed in proximity to the sidewall 405 of the conductive body 401. The seed layer (4061, 4063) in FIG. 4B is positioned between the conductive body 401 and the conductive layer (4021, 4023). The microstructures of the carrier 407, and the contact pad 404, and the seed layer (4061, 4063) are not shown in FIG. 4B.

Figure 5:
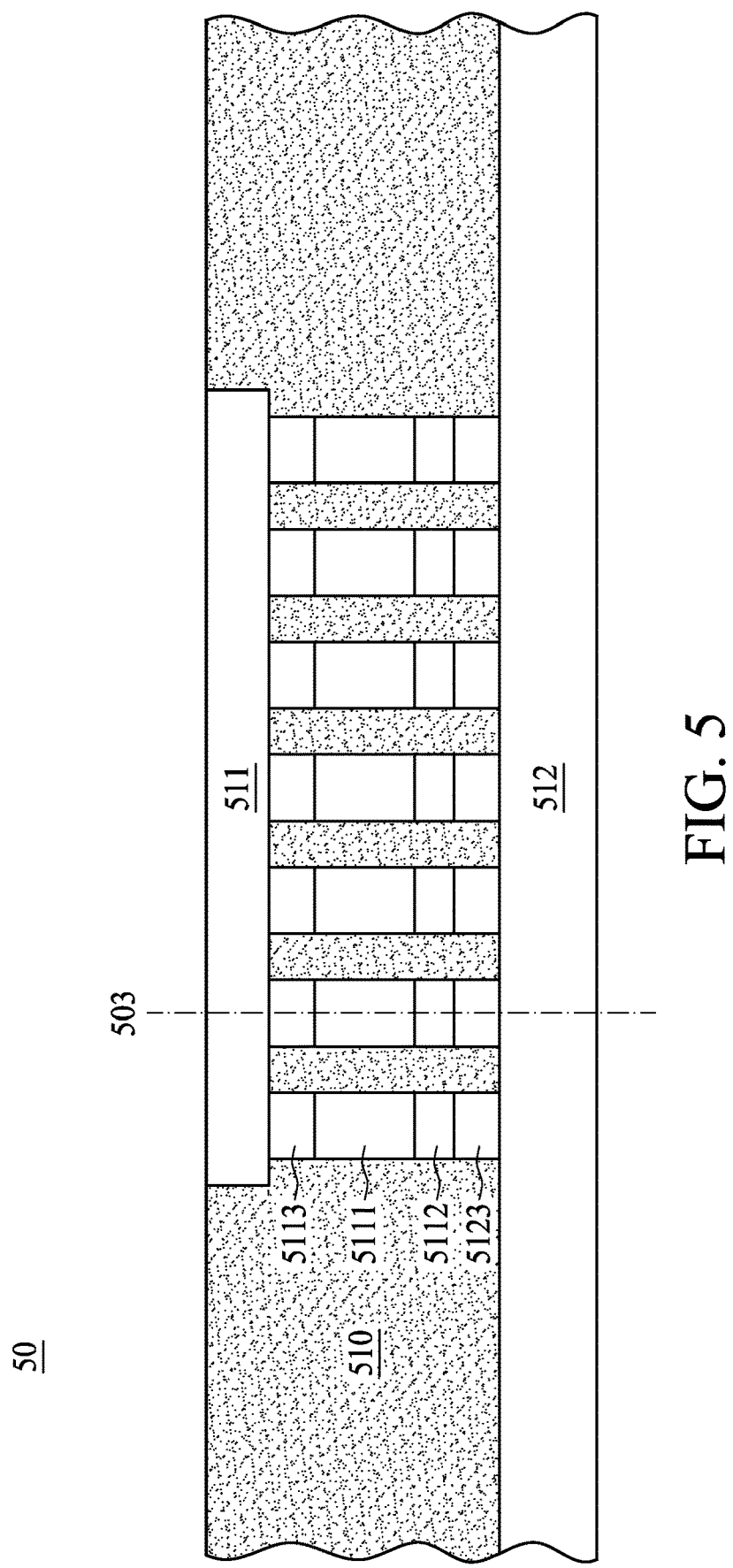
FIG. 5 is a cross sectional view of a semiconductor package according to some embodiments of the present disclosure.

FIG. 5 is a 3D stacked packaging arrangement 50 having a die-on-package assembly. A singulated semiconductor die 511 has several contact pads 5113 positioned on a surface of the singulated semiconductor die 511. A semiconductor package 512 has several contact pads 5123 positioned on a surface thereof. For simplicity, only one contact pad 5113 on the singulated semiconductor die 511 and one contact pad 5123 on the semiconductor package 512 are labeled in FIG. 5. The interconnect structure between the singulated semiconductor die 511 and the semiconductor package 512 includes a conductive body 5111 and a conductive layer 5112.

In FIG. 5, one end of the conductive body 5111 is connected to the contact pad 5113 of the singulated semiconductor die 511, and the opposite end of the conductive body 5111 is connected to the conductive layer 5112. The conductive layer 5112 is connected to one of the contact pads 5123 positioned on a surface of the semiconductor package 512. The longitudinal direction 503 of the conductive body 5111 shown in FIG. 5 is perpendicular to both the singulated semiconductor die 511 and the semiconductor package 512. A molding compound 510 is filled in the spaces between the conductive bodies 5111 to encapsulate the singulated semiconductor die 511.

Figure 6:
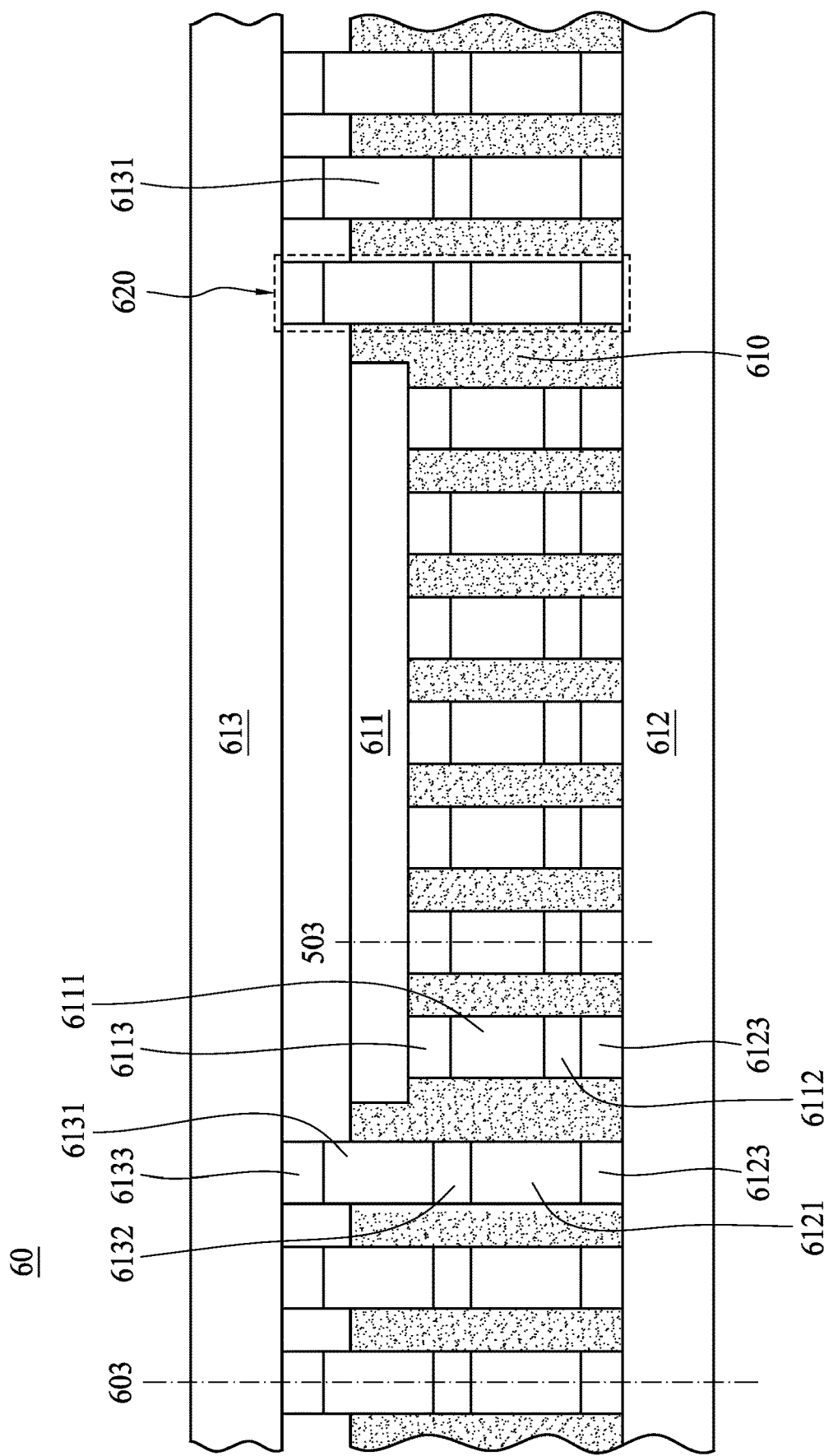
FIG. 6 is a cross sectional view of a semiconductor package according to some embodiments of the present disclosure.

FIG. 6 is a 3D stacked packaging arrangement 60 having a die-in-package and a package-on-package assembly. A singulated semiconductor die 611 has several contact pads 6113 positioned on a surface of the singulated semiconductor die 611. A semiconductor package 612 has several contact pads 6123 positioned on a surface thereof. A semiconductor package 613 has several contact pads 6133 positioned on a surface thereof. For simplicity, only one contact pad 6113 on the singulated semiconductor die 611, one contact pad 6123 on the semiconductor package 612, and one contact pad 6133 on the semiconductor package 613 are labeled in FIG. 6.

The interconnect structure between the singulated semiconductor die 611 and the semiconductor package 612 includes a conductive body 6111 and a conductive layer 6112. The interconnect structure between the semiconductor package 612 and the semiconductor package 613 includes two conductive bodies (6131, 6121) and a conductive layer 6132. In FIG. 6, the longitudinal direction 603 of the conductive body 6111 is perpendicular to both the singulated semiconductor die 611 and the semiconductor package 612. The longitudinal direction 603 of the conductive bodies (6131, 6121) is perpendicular to both the semiconductor package 612 and the semiconductor package 613. In some embodiments, a molding compound 610 is filled in the spaces between the conductive bodies 6111, and partially filled in the spaces between the conductive bodies (6131, 6121).

Figure 7:
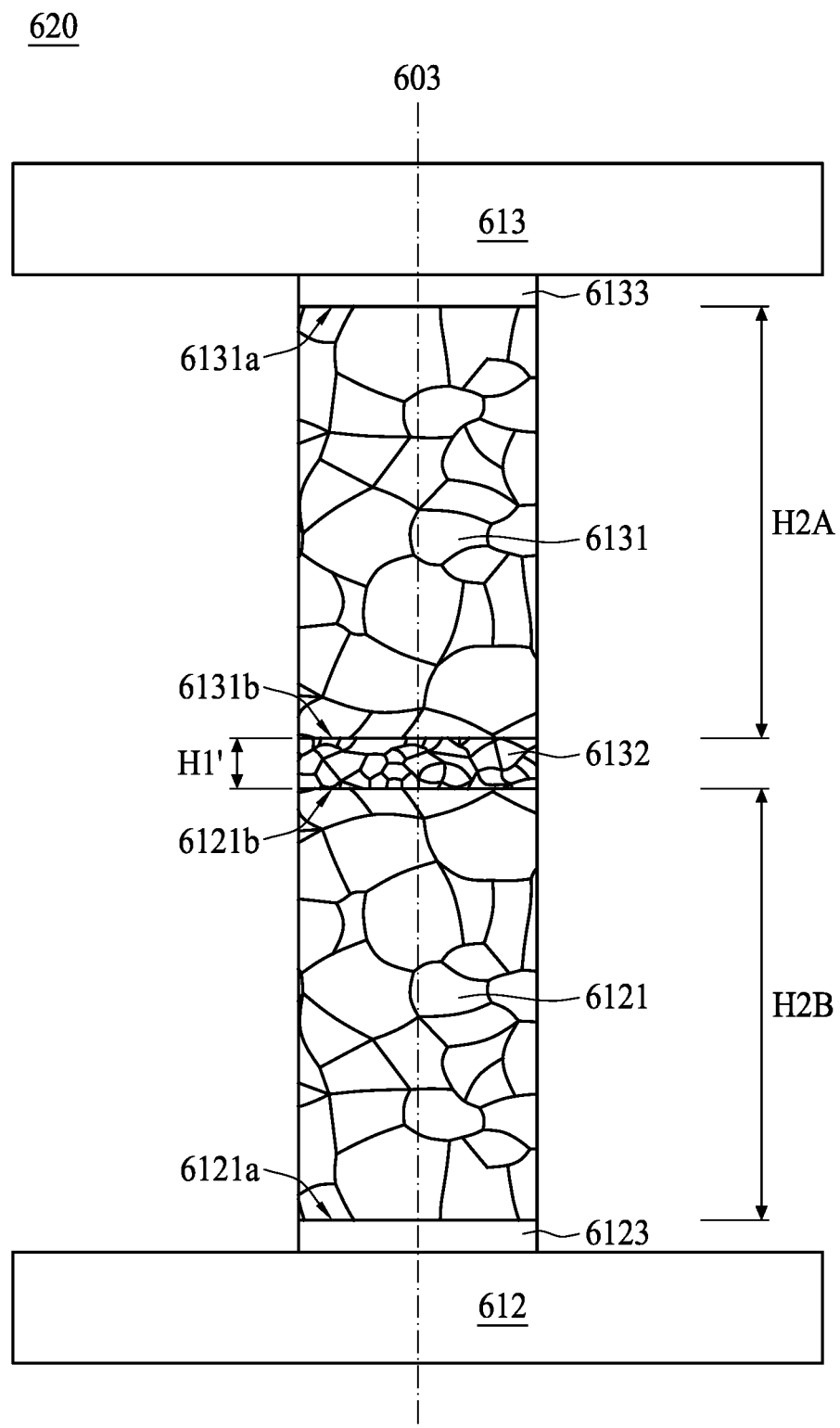
FIG. 7 is the microstructure of the cross sectional plane (Plane A) corresponding to the AA sectioning direction in FIG. 1, according to some embodiments of the present disclosure.

FIG. 7 is an enlarged view of an interconnect structure 620 shown in FIG. 6. The interconnect structure 620 includes a conductive body 6121 associated with the semiconductor package 612, a conductive body 6131 associated with the semiconductor package 613, and a conductive layer 6132 sandwiched between the two conductive bodies (6131, 6121). A first end 6131a of the conductive body 6131 and a third end 6121a of the conductive body 6121 are connected to contact pads (6133, 6123), respectively. A second end 6131b of the conductive body 6131 and a fourth end 6121b of the conductive body 6121 are in contact with the conductive layer 6132. The microstructure of the contact pads (6133, 6123) are not shown in FIG. 7.

In some embodiments, the conductive body 6121 has an average grain size (a) on an A plane, the conductive body 6131 has an average grain size (c) on an A plane, and the conductive layer 6132 has an average grain size (b) on an A plane. The average grain size measurement is discussed in detail with reference to the Definition "average grain size" herein. The A plane is discussed in detail with reference to FIG. 2A herein.

In some embodiments, as shown in FIG. 7, the average grain size (a) in the conductive body 6121 is substantially identical to the average grain size (c) in the conductive body 6131, and either the average grain size (a) or the average grain size (c) is greater than the average grain size (b) in the conductive layer 6132. In some embodiments, the average grain size (a) is 8 times greater than the average grain size (b).

In FIG. 7, the B plane traversing the conductive layer 6132 has a homogeneous grain size distribution as that shown in FIG. 2B herein. The details of B plan is previously discussed with reference to FIG. 1 and FIG. 2B. In some embodiments, either the height H2A of the conductive body 6131 in the longitudinal direction 603 or the height H2B of the conductive body 6121 in the longitudinal direction 603 is greater than the height H1' of the conductive layer 6132 in the longitudinal direction 603. In some embodiments, the height H2A is 300 times greater than the height H1'. In some embodiments, the height H2B is 500 times greater than the height H1'. However, the heights H2A and H2B do not have to be identical. Different values of H2A and H2B are within the contemplated scope of the present disclosure.

Figure 8A:
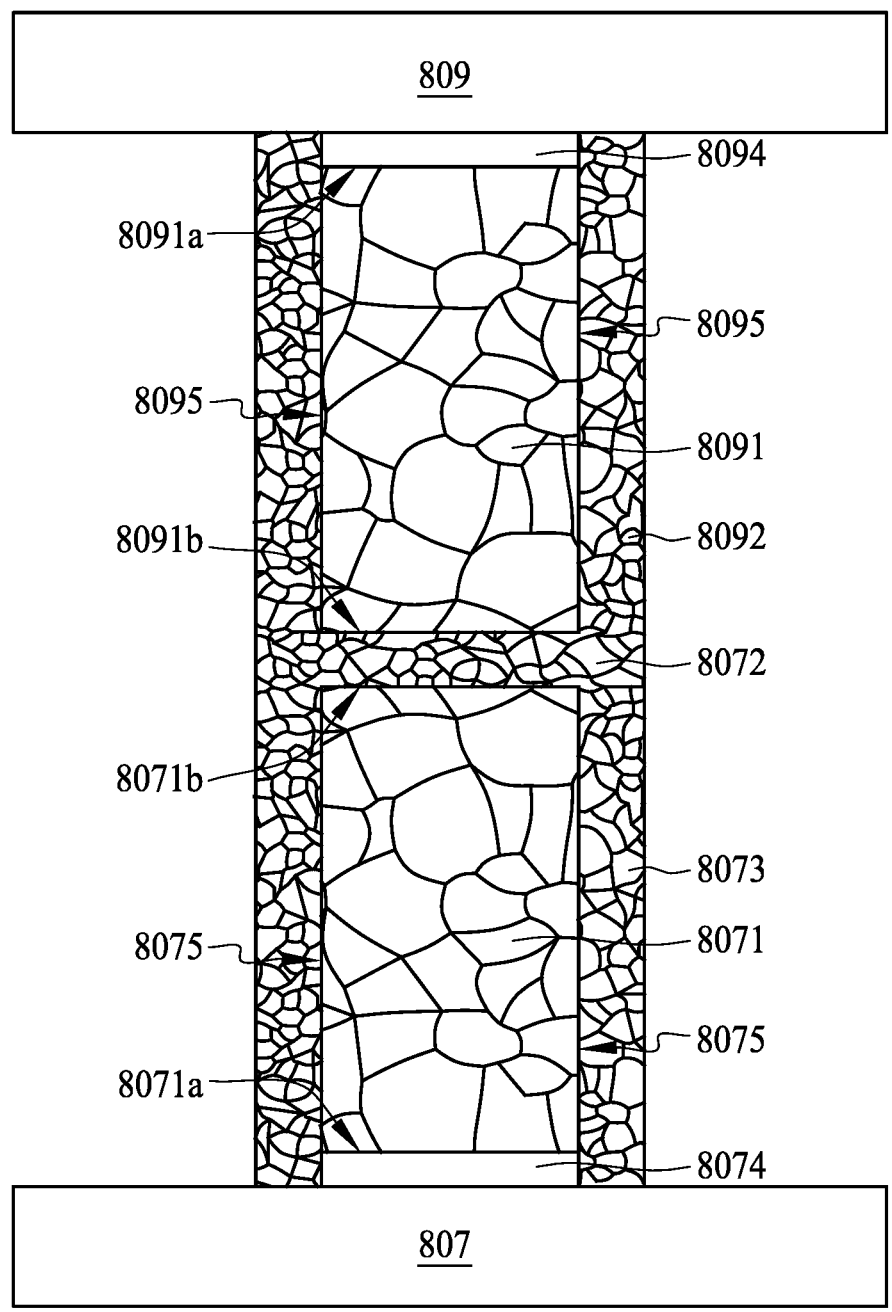
FIG. 8A and FIG. 8B are the microstructure of the cross sectional planes (Plane A) corresponding to the AA sectioning direction in FIG. 1, according to some embodiments of the present disclosure.
Figure 8B:
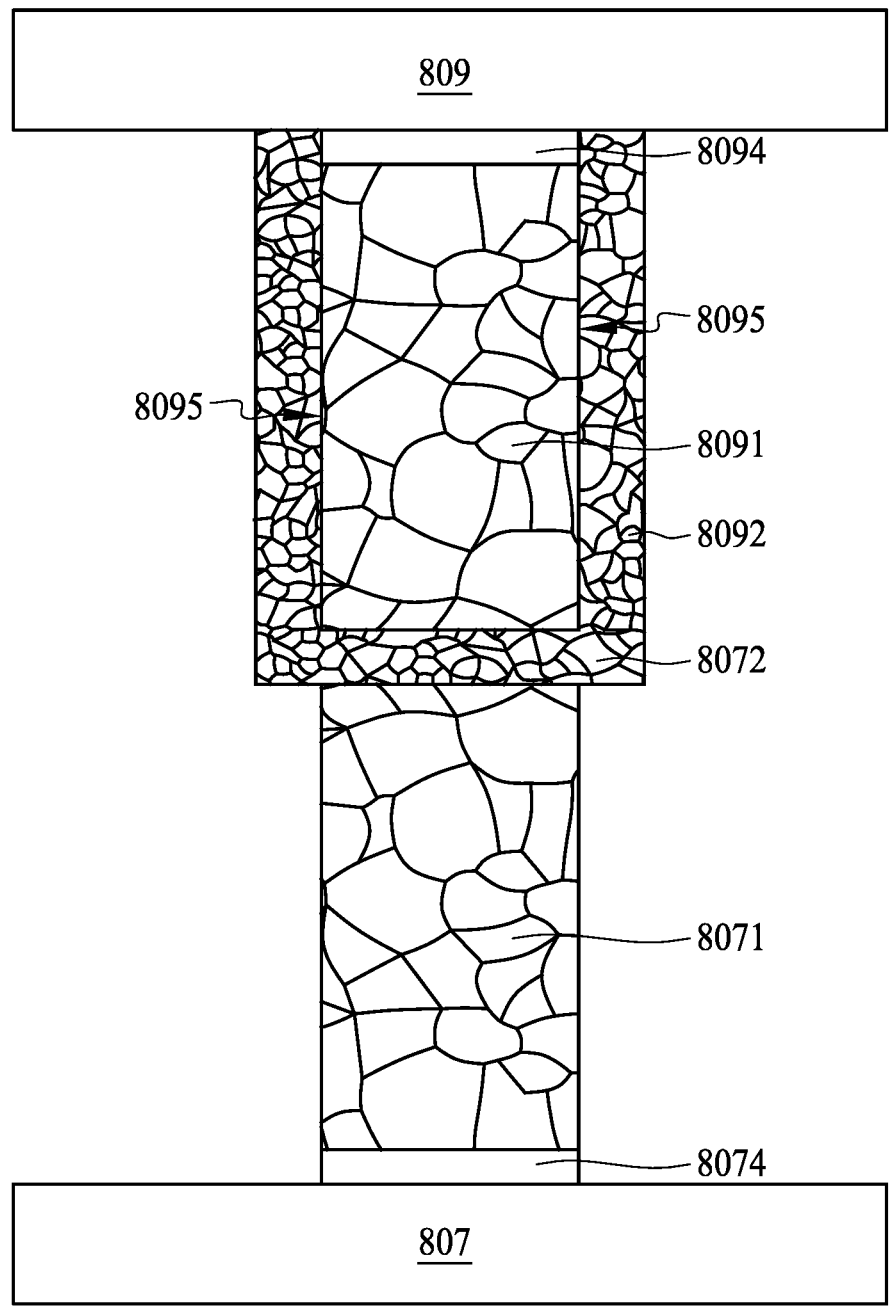

FIG. 8A and FIG. 8B are the A plane microstructure of some embodiments in the present disclosure. In FIG. 8A, the interconnect structure 80A includes a conductive body 8071 associated with a semiconductor package 807, a conductive body 8091 associated with the semiconductor package 809, and a conductive layer 8072 sandwiched between the two conductive bodies (8071, 8091). A first end 8071a of the conductive body 8071 and a third end 8091a of the conductive body 8091 are connected to contact pads (8074, 8094), respectively. A second end 8071b of the conductive body 8071 and a fourth end 8091b of the conductive body 8091 are in contact with the conductive layer 8072. The microstructure of the contact pads (8074, 8094) are not shown in FIG. 8A.

In some embodiments, the conductive bodies (8071, 8091) are both in a shape of a cylindrical pillar, and hence the sidewalls (8075, 8095) of the conductive bodies (8071, 8091) are continuous surfaces. However, the conductive bodies (8071, 8091) do not have to be in identical shape. In some embodiments, the conductive body 8071 is a cylindrical pillar, whereas the conductive body 8091 is a quadrangular prism. Conductive layers (8073, 8092) are disposed at the sidewalls (8075, 8095) of the conductive bodies (8071, 8091), respectively.

FIG. 8B is the microstructures in the A plane of some embodiments of the present disclosure. All the labels in FIG. 8A apply to the elements presented in FIG. 8B. FIG. 8B is an interconnect structure 80B combining an upper half (the conductive body 8091 and the conductive layer 8092) of the interconnect structure 80A shown in FIG. 8A, and a lower half (the conductive body 6121 and the conductive layer 6132) of the interconnect structure 620 shown in FIG. 7.

Figure 9A:
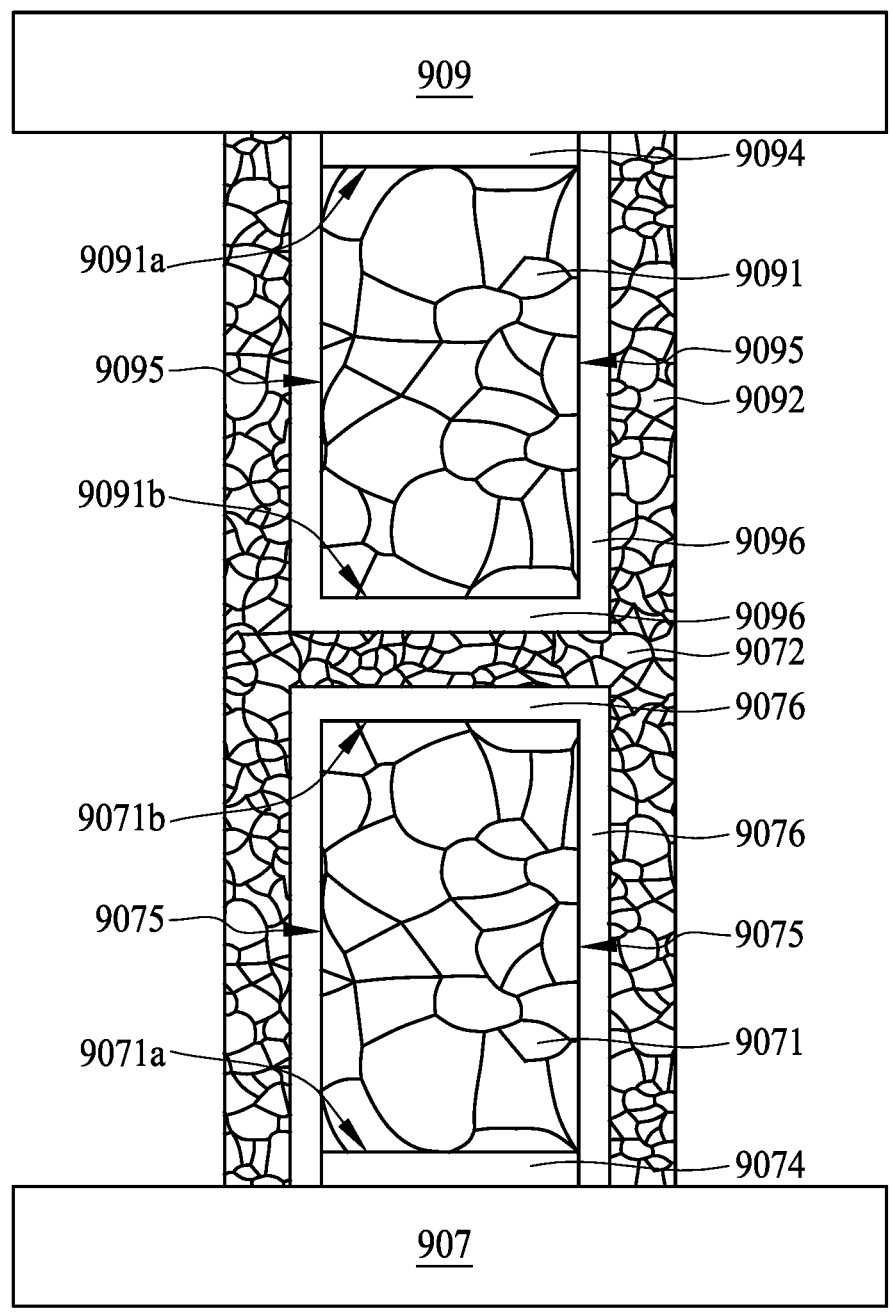
FIG. 9A and FIG. 9B are the microstructure of the cross sectional planes (Plane A) corresponding to the AA sectioning direction in FIG. 1, according to some embodiments of the present disclosure.
Figure 9B:
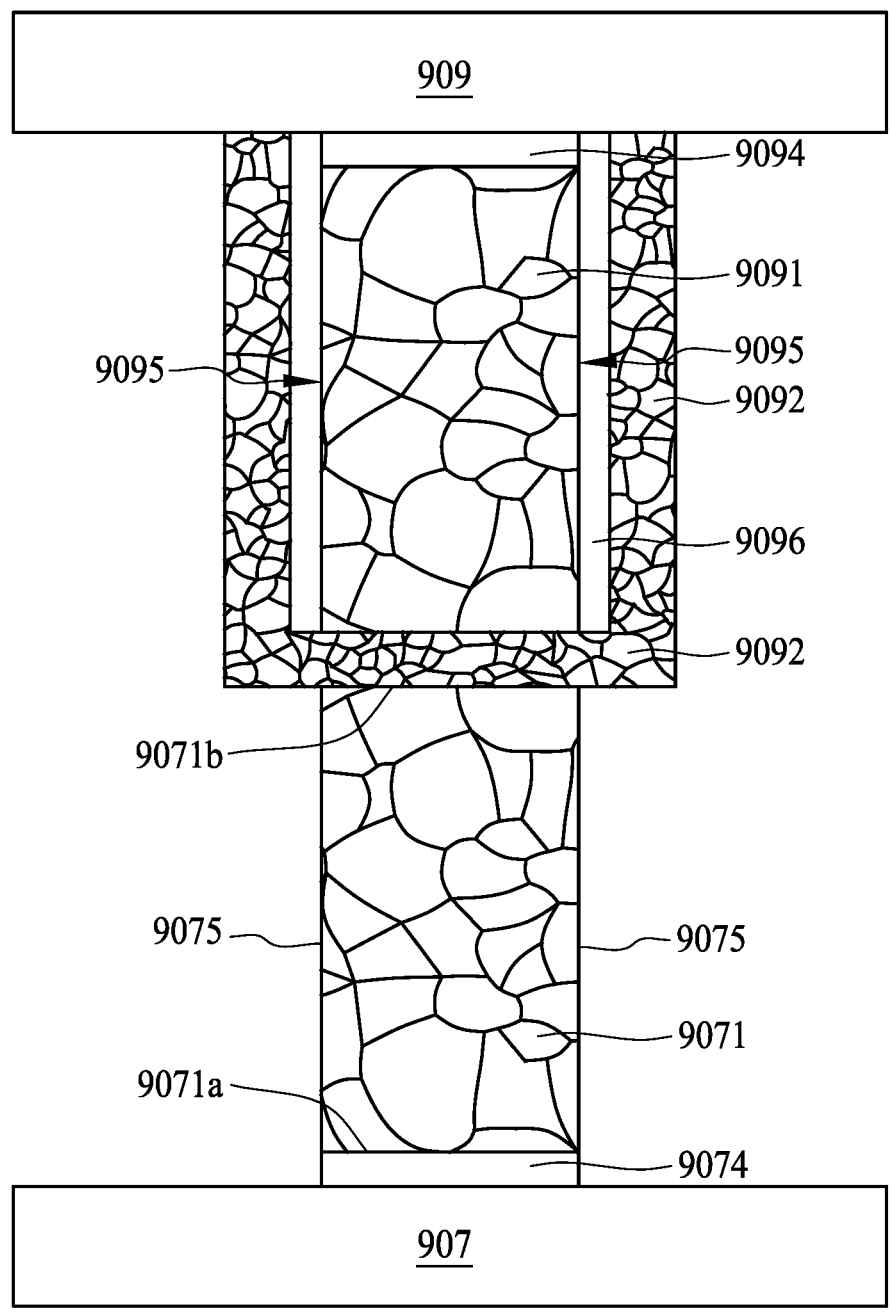

FIG. 9A and FIG. 9B are the A plane microstructure of some embodiments in the present disclosure. In FIG. 9A, the interconnect structure 90A includes a conductive body 9071 associated with a semiconductor package 907, a conductive body 9091 associated with the semiconductor package 909, and a conductive layer 9072 sandwiched between the two conductive bodies (9071, 9091). A first end 9071a of the conductive body 9071 and a third end 9091a of the conductive body 9091 are connected to contact pads (9074, 9094), respectively. A second end 9071b of the conductive body 9071 and a fourth end 9091b of the conductive body 9091 are in contact with the conductive layer 9072. The microstructure of the contact pads (9074, 9094) are not shown in FIG. 9A.

In some embodiments, as shown in FIG. 9A, seed layers 9076 are positioned at the second end 9071b and the sidewall 9075 of the conductive body 9071; seed layers 9096 are positioned at the fourth end 9091b and the sidewall 9095 of the conductive body 9091. The seed layers (9076, 9096) are disposed between the conductive bodies (9071, 9091) and the conductive layer (9073, 9092).

FIG. 9B is the microstructures in the A plane of some embodiments of the present disclosure. All the labels in FIG. 9A apply to the elements present in FIG. 9B. FIG. 9B is an interconnect structure 90B combining an upper half (the conductive body 9091 and the conductive layer 9092) of the interconnect structure 90A shown in FIG. 9A, and a lower half (the conductive body 6121 and the conductive layer 6132) of the interconnect structure 620 shown in FIG. 7. In some embodiments, an additional seed layer (not shown) is positioned at the second end 9071b of the conductive body 9071.

Figure 10A:
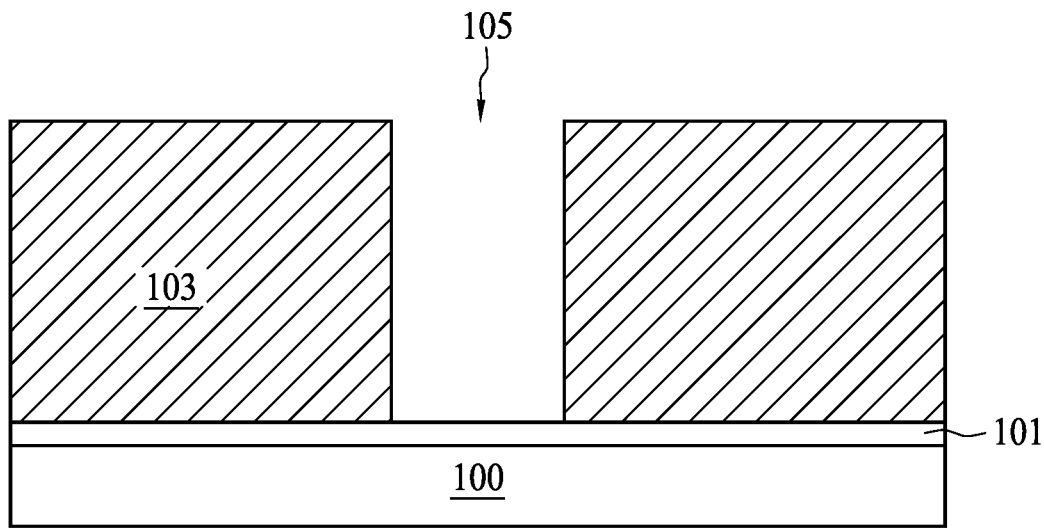
FIG. 10A to FIG. 10D are some of the manufacturing operations used to obtain the conductive interconnect structures according to some embodiments of the present disclosure.

FIG. 10A to FIG. 10D describe several operations in a manufacturing method for conductive interconnect structures described in some embodiments of the present disclosure. FIG. 10A is an operation of disposing a cover layer 103 on a semiconductor package 100. In some embodiments, a seed layer 101 is deposited on the semiconductor package 100 prior to the disposition of the cover layer 103. The seed layer 101 composing a stack of Ti/Cu/Ti (30/1000/10 nm) is DC (Direct Current) sputtered on the semiconductor package 100. In some embodiments, a through opening 105 is formed in the cover layer 103 through a patterning operation. The cover layer 103 in said embodiments are made of photoresist. In other embodiments, the cover layer 103 is made of silicon dioxide hard mask.

Figure 10B:
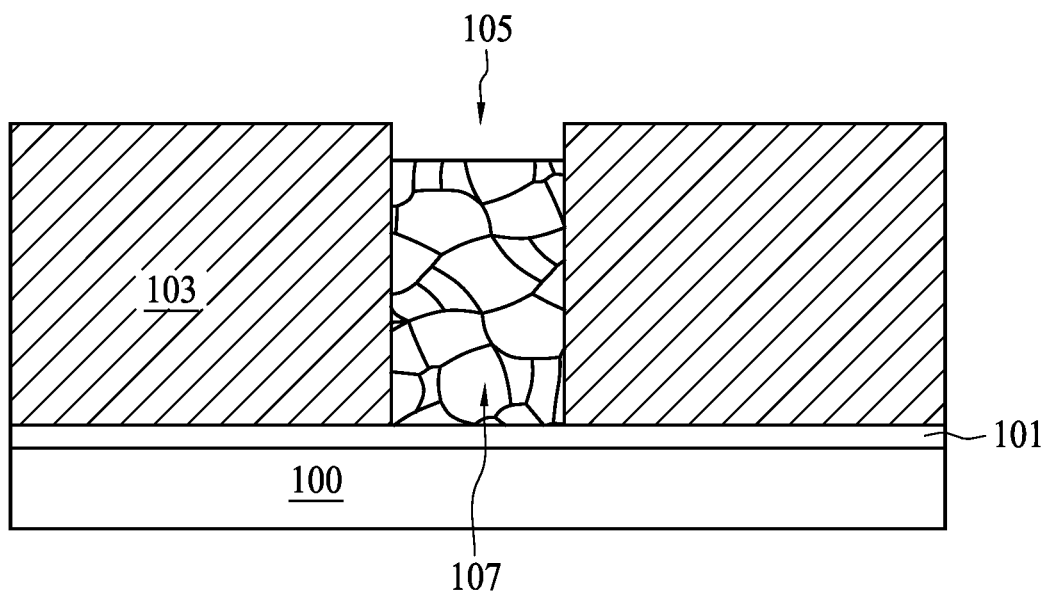

FIG. 10B is an operation of filling a first conductive material 107 into the through opening 105 in the cover layer 103 by a first operation. In some embodiments, the first conductive material 107 is conductive copper. However, other conductive materials can be used and are within the contemplated scope of the present disclosure. The electroplating solution of the first copper electroplating operation contains 0.5M $H_2SO_4$, 0.5M $CuSO_4$, 0.25M brightener, and 0.25M carrier. The electroplating operation is performed at room temperature and at 2.5 A constant current for 1600 seconds.

Figure 10C:
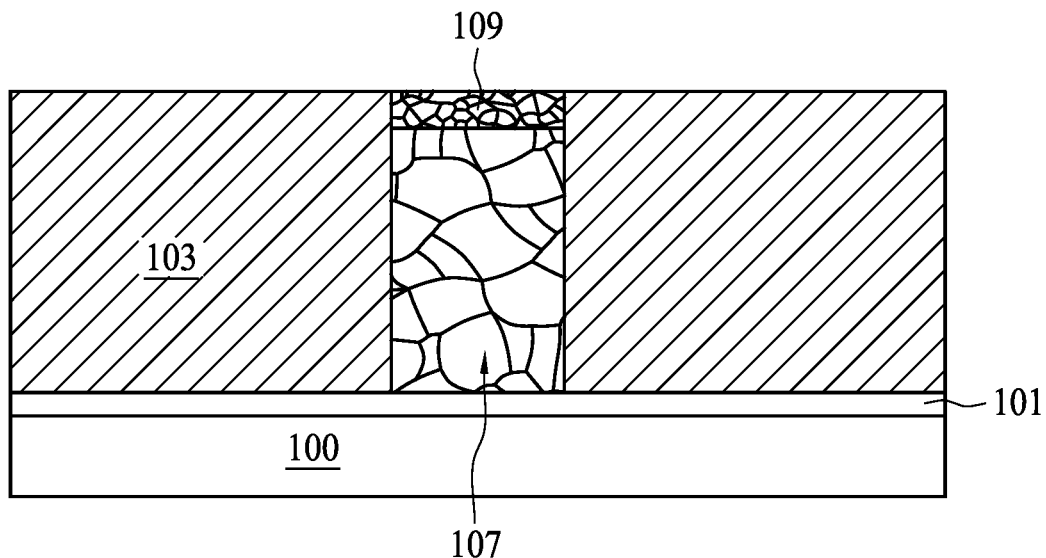

FIG. 10C is an operation of forming a second conductive material 109 on an outer surface of the first conductive material 107 by a second operation. As shown in FIG. 10C, the outer surface is positioned at a second end 107b, as opposed to a first end 107a, of the first conductive material 107. In some embodiments, the second conductive material 109 is conductive copper. In some embodiments, the second operation is also an electroplating operation. The first operation and the second operation are the same deposition type but with operation parameters. The electroplating solution of the second copper electroplating operation contains 0.5M $H_2SO_4$, 0.5M $CuSO_4$, 0.25M brightener, and 0.25M carrier. The electroplating operation is performed at room temperature and at 7 A constant current for 120 seconds.

Figure 10D:
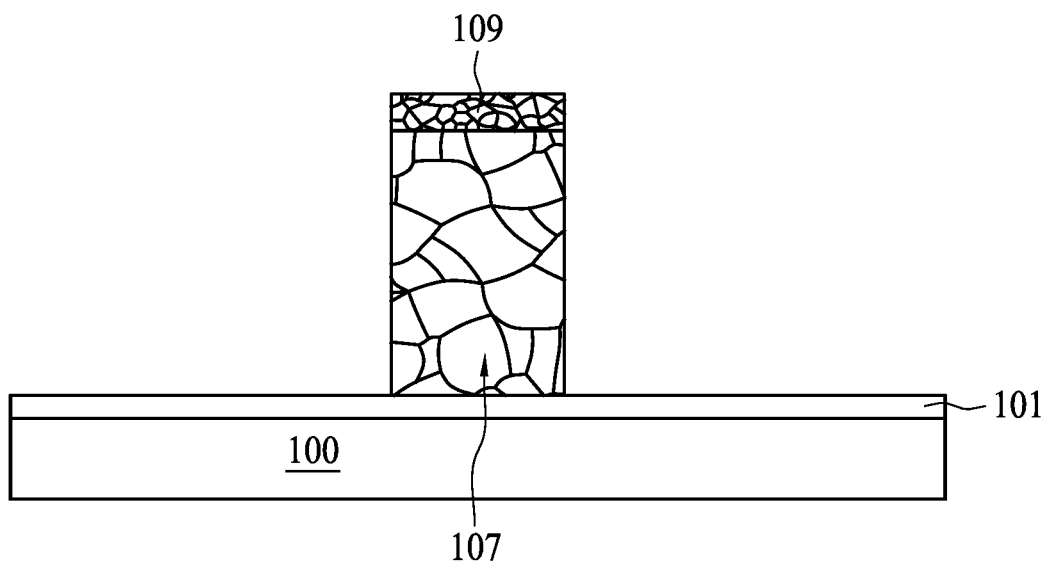

The cover layer 103 is subsequently removed as illustrated in FIG. 10D. In some embodiments, the first conductive material 107 corresponds to the conductive body 101, and the second conductive material 109 corresponds to the conductive layer 102 with reference to FIG. 1.

In some embodiments, two interconnect structures as shown in FIG. 10D are further aligned using a flip chip bonder to form an interconnect structure in a 3D stacked packaging arrangement 60 with reference to the interconnect structure 620 of FIG. 6. A temperature between 180° C. and 350° C., a pressure between 10 MPa and 100 MPa, and a duration of from 10 s to 100 s are applied to the surfaces of the second conductive material 109 to be bonded. In some embodiments, the average grain size (a) of the copper electroplated after the bonding operation is around 500 to 2500 nm; and the average grain size (b) of the copper electroplated after the bonding operation is around 200 to 800 nm. As a result, the average grain size (a) is 1.5 to 5 times greater than the average grain size (b) in said embodiments.

In some embodiments, in order to decrease the average grain size (b) of the second conductive material 109, a post-deposition annealing operation is omitted. The high temperature treatment (400° C. used in some embodiments in the present disclosure) applied during the bonding operation serves the purpose of the post-deposition annealing operation, that is, to reduce the internal stress of the as-electroplated layer.

Figure 11A:
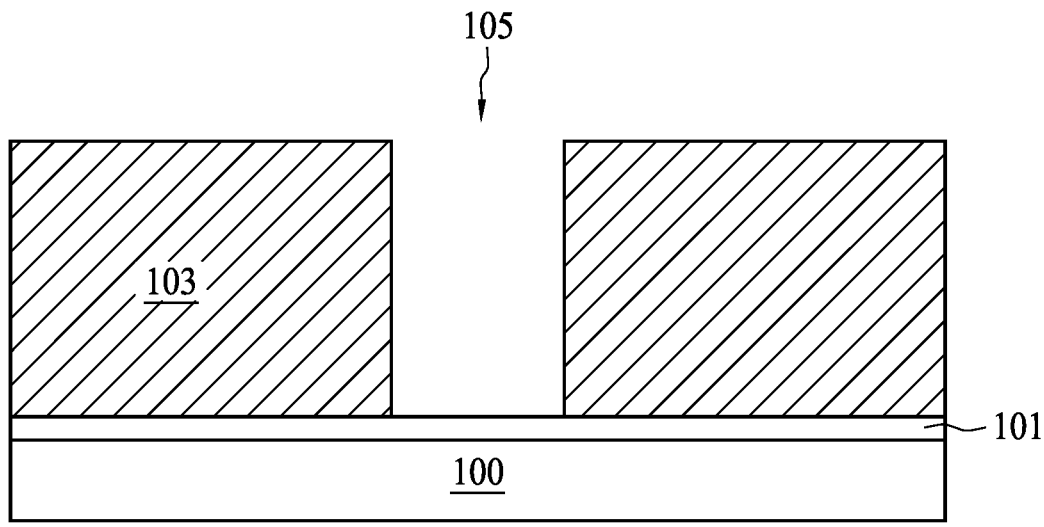
FIG. 11A to FIG. 11E are some of the manufacturing operations used to obtain the conductive interconnect structures according to some embodiments of the present disclosure.

FIG. 11A to FIG. 11E describe several operations in a manufacturing method for conductive interconnect structures described in some embodiments of the present disclosure. FIG. 11A is an operation of disposing a cover layer 103 on a semiconductor package 100. In some embodiments, a seed layer 101 is deposited on the semiconductor package 100 prior to the disposition of the cover layer 103. In some embodiments, a through opening 105 is formed in the cover layer 103 through a patterning operation.

Figure 11B:
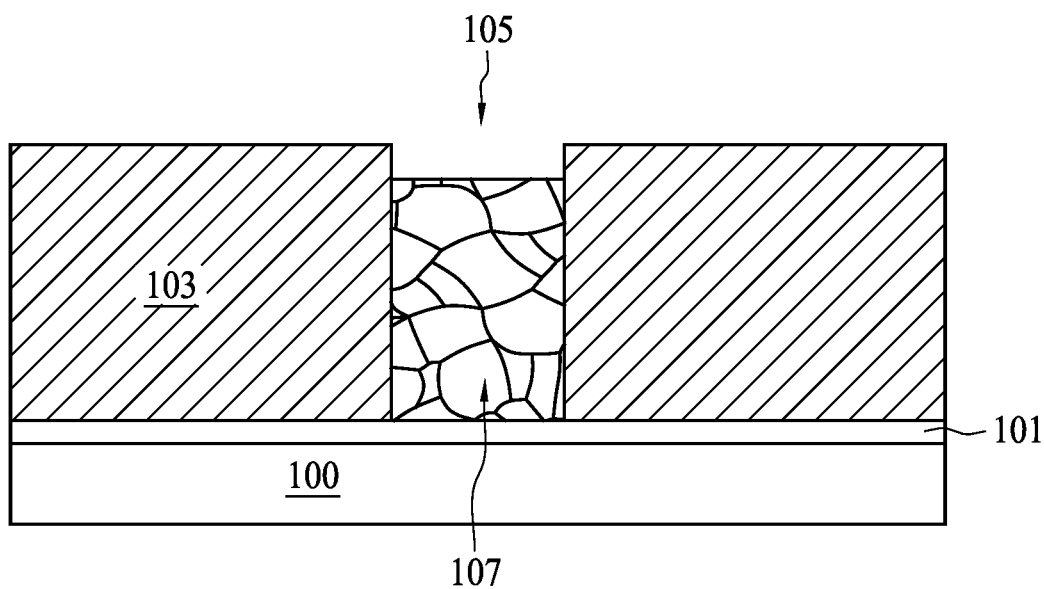

FIG. 11B is an operation of filling a first conductive material 107 into the through opening 105 in the cover layer 103 by a first operation. In some embodiments, the first conductive material 107 is conductive copper. However, other conductive materials can be used and are within the contemplated scope of the present disclosure. The electroplating solution of the first copper electroplating operation contains 0.5M $H_2SO_4$, 0.5M $CuSO_4$, 0.25M brightener, and 0.25M carrier. The electroplating operation is performed at room temperature and at 2.5 A constant current for 1500 seconds.

Figure 11C:
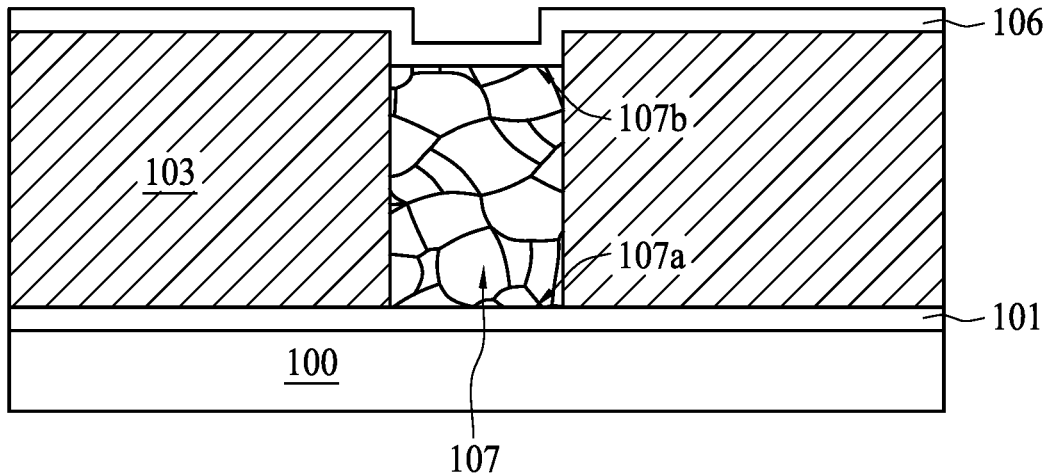

FIG. 11C is an operation of forming a seed layer 106 at an outer surface of the first conductive material 107. In some embodiments, the formation of the seed layer 106 is a sputtering operation. By using a sputtering operation, the seed layer 106 is not only deposited on a second end 107b of the first conductive material 107, but also the top surface of the cover layer 103. However, other deposition methods, for example, electroplating, electroless plating, or atomic layer deposition (ALD), permitting the seed layer 106 with a desired surface roughness to be formed, are within the contemplated scope of the present disclosure.

Figure 11D:
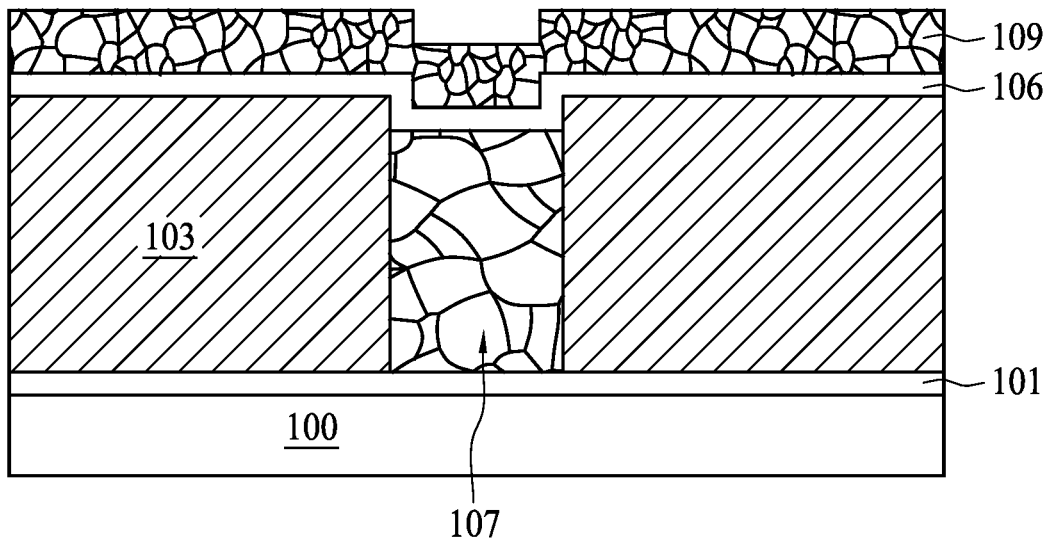

FIG. 11D is an operation of forming a second conductive material 109 on an outer surface of the first conductive material 107 by a second operation. As shown in FIG. 11D, the outer surface is positioned at a second end 107b, as opposed to a first end 107a, of the first conductive material 107. In some embodiments, the second conductive material 109 is conductive copper. In some embodiments, the second operation is an electroless plating operation. The electroless plating bath of the second copper deposition operation contains copper sulfate, ethylenediaminetetra acetic acid, and formaldehyde. The electroless plating is carried out at an elevated temperature of 40° C. for 1.5 hours. The electroless-plated second conductive materials 109 forms a blanket layer on both the top surface of the first conductive material 107 and the top surface of the cover layer 103.

Figure 11E:
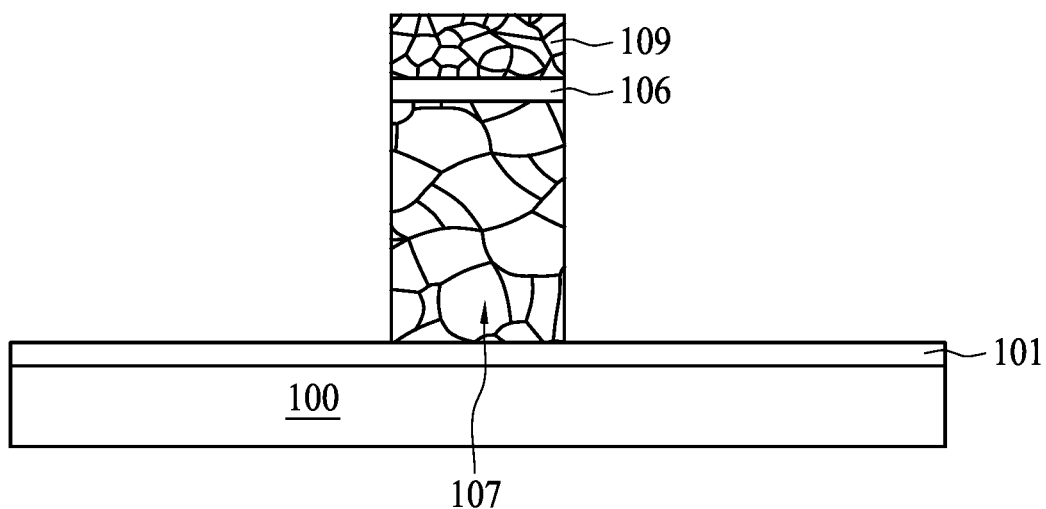

In FIG. 11E, the cover layer 103 is subsequently removed and the second conductive layer 109 residing on the cover layer 103 is concurrently lift off. In some embodiments, the first conductive material 107 corresponds to the conductive body 101, and the second conductive material 109 corresponds to the conductive layer 102 with reference to FIG. 1.

In some embodiments, two interconnect structures as shown in FIG. 11E are further aligned using a flip chip bonder to form an interconnect structure in a 3D stacked packaging arrangement 60 with reference to the interconnect structure 620 of FIG. 6. A temperature of from 150° C. to 350° C. a pressure of from 10 MPa to 100 MPa, and a duration of from 10 s to 100 s are applied to the surfaces of the second conductive material 109 to be bonded. In some embodiments, the average grain size (a) of the electroplated copper after the bonding operation is around 200 to 800 nm; and the average grain size (b) of the electroless-plated copper after the bonding operation is below 200 nm. As a result, the difference between the average grain size (a) and the average grain size (b) is over 100 nm in said embodiments.

Figure 12A:
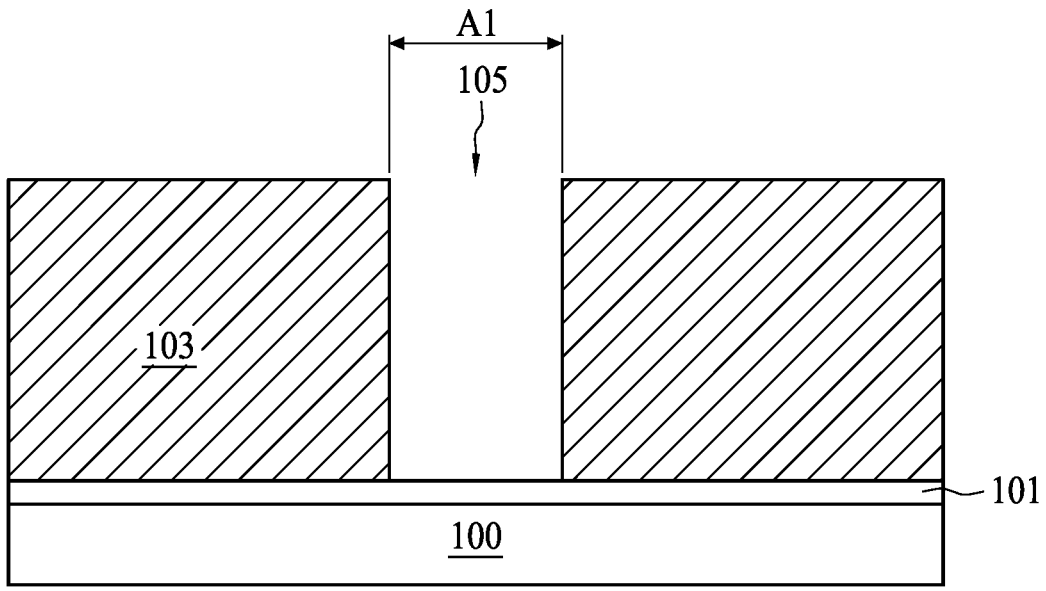
FIG. 12A to FIG. 12E are some of the manufacturing operations used to obtain the conductive interconnect structures according to some embodiments of the present disclosure.

FIG. 12A to FIG. 12E describe several steps in a manufacturing method for conductive interconnect structures described in some embodiments of the present disclosure. FIG. 12A is an operation of disposing a cover layer 103 on a semiconductor package 100. In some embodiments, a seed layer 101 is deposited on the semiconductor package 100 prior to the disposition of the cover layer 103. In some embodiments, a through opening 105 with a width of A1 is formed in the cover layer 103 through a patterning operation. In certain embodiments, the through opening 105 has a cylindrical shape, and hence the bottom area of said through opening 105 is substantially a circular shape. As a result the width A1 is the diameter of the circular shape.

Figure 12B:
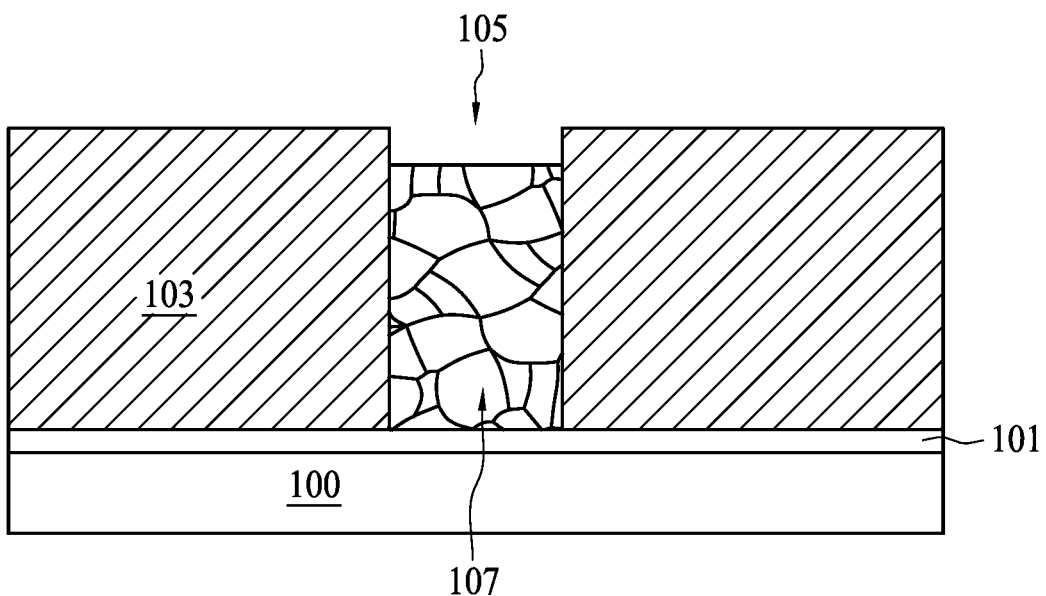

FIG. 12B is an operation of filling a first conductive material 107 into the through opening 105 having a width of A1 in the cover layer 103 by a first operation. In some embodiments, the first conductive material 107 is conductive copper. However, other conductive materials can be used and are within the contemplated scope of the present disclosure. In some embodiments, the first operation is an electroplating operation. The electroplating solution of the first copper electroplating operation contains 0.5M $H_2SO_4$, 0.5M $CuSO_4$, 0.25M brightener, and 0.25M carrier. The electroplating operation is performed at room temperature and at 2.5 A constant current for 800 seconds.

Figure 12C:
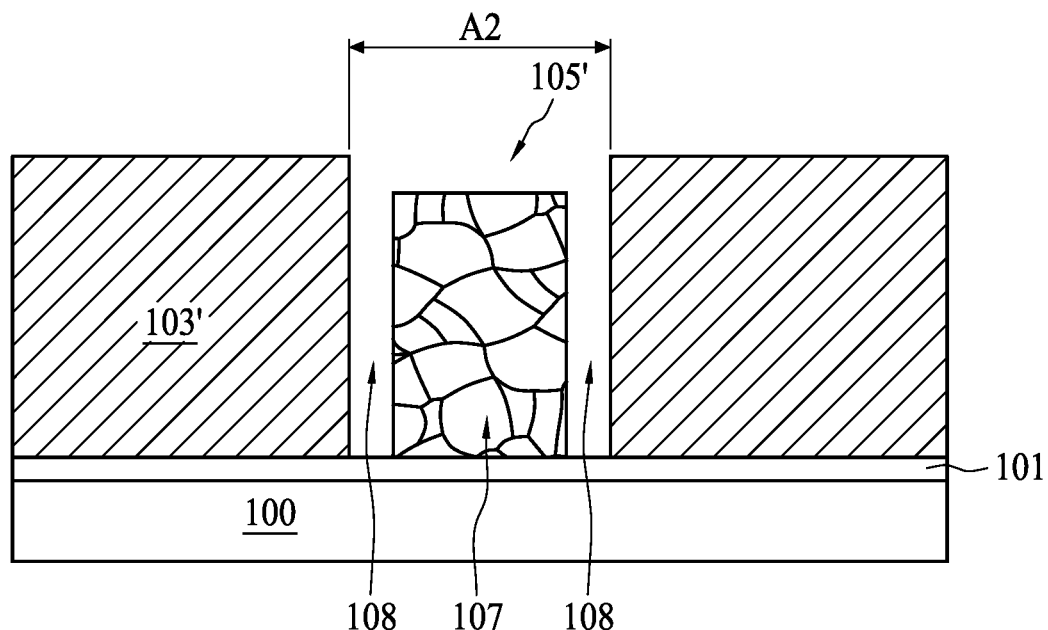

FIG. 12C is an operation of forming a mask layer 103' around the first conductive material 107. In some embodiments, the mask layer 103' is obtained by a subsequent patterning operation applied on the cover layer 103 shown in FIG. 12B. The through opening 105' in the mask layer 103' has a width of A2 that is greater than the width of A1 shown in FIG. 12A. Because the dimension of the through opening 105' is larger than the through opening 105, a gap 108 is formed between the mask layer 103' and a sidewall 107s of the first conductive material 107.

In some embodiments, the mask layer 103' is obtained by removing the cover layer 103 shown in FIG. 12B and reforming a mask layer 103' having a through opening 105' as shown in FIG. 12C. The through opening 105' in the mask layer 103' has a width of A2 that is greater than the width of A1 shown in FIG. 12A. Because the dimension of the through opening 105' is larger than the through opening 105, a gap 108 is formed between the mask layer 103' and a sidewall 107s of the first conductive material 107.

Figure 12D:
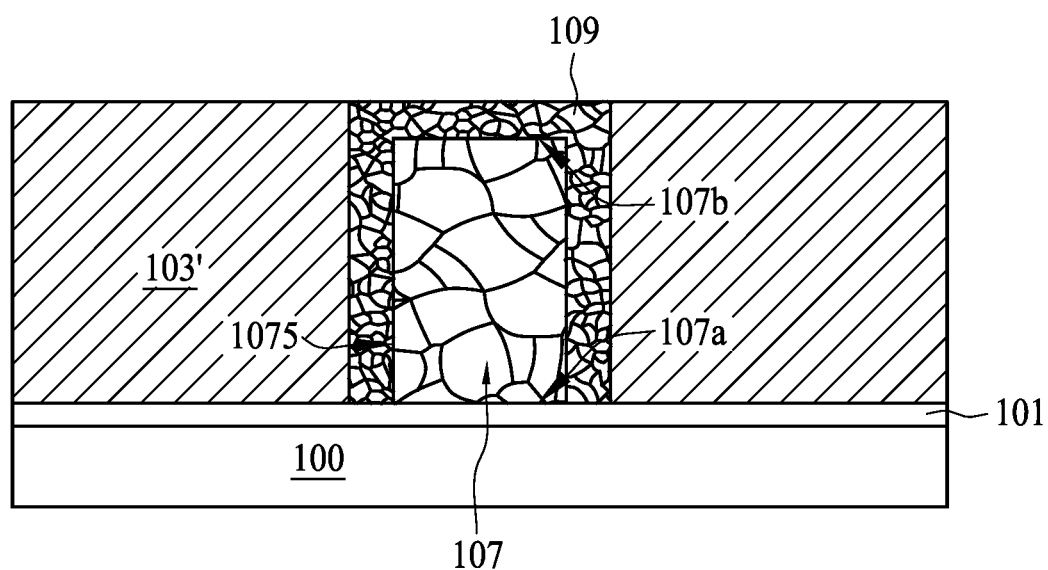

FIG. 12D is an operation of forming a second conductive material 109 on an outer surface of the first conductive material 107 by a second operation. As shown in FIG. 12D, the outer surface includes a second end 107b (as opposed to a first end 107a) and a sidewall 107s of the first conductive material 107. In some embodiments, the second conductive material 109 is conductive copper. In some embodiments, the second operation is also an electroplating operation. The first operation and the second operation are the same deposition type but with operation parameters. The electroplating solution of the second copper electroplating operation contains 0.5M $H_2SO_4$, 0.5M $CuSO_4$, 0.25M brightener, and 0.25M carrier. The electroplating operation is performed at room temperature and at 7 A constant current for 250 seconds. In some embodiments, the second conductive material 109 completely fills the gaps 108. In some embodiments, the second conductive material 109 partially fills the gaps 108.

Figure 12E:
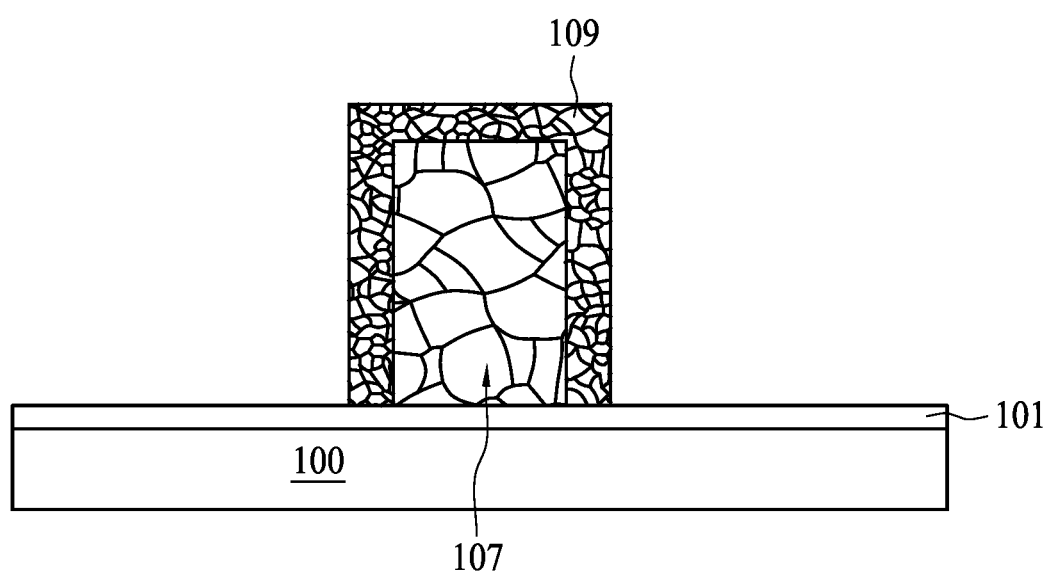

The mask layer 103' is subsequently removed as illustrated in FIG. 12E. In some embodiments, the first conductive material 107 corresponds to the conductive body 101, and the second conductive material 109 corresponds to the conductive layer 102 with reference to FIG. 1.

In some embodiments, two interconnect structures as shown in FIG. 12E are further aligned using a flip chip bonder to form an interconnect structure in a 3D stacked packaging arrangement 60 with reference to the interconnect structure 620 of FIG. 6. A temperature of from 150° C. to 350° C., a pressure of from 10 Mpa to 100 Mpa, and a duration of from 10 s to 100 s are applied to the surfaces of the second conductive material 109 to be bonded. In some embodiments, the average grain size (a) of the copper electroplated after the bonding operation is of from 500 nm to 2500 nm; and the average grain size (b) of the copper electroplated after the bonding operation is of from 200 nm to 500 nm. As a result, the difference between the average grain size (a) and the average grain size (b) is over 100 nm in said embodiments.

Figure 13A:
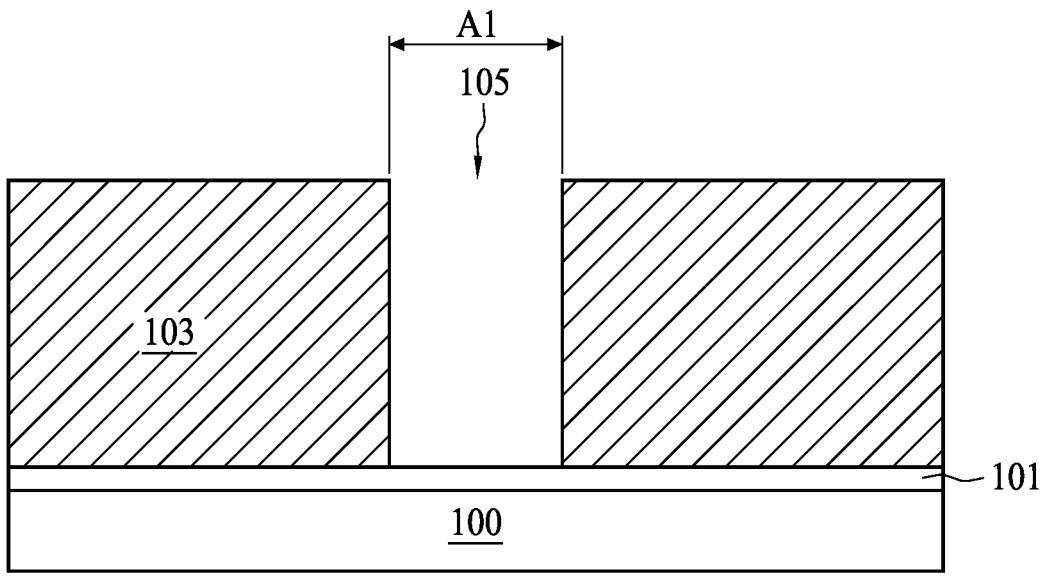
FIG. 13A to FIG. 13F are some of the manufacturing operations used to obtain the conductive interconnect structures according to some embodiments of the present disclosure.

FIG. 13A to FIG. 13F describe several steps in a manufacturing method for conductive interconnect structures described in some embodiments of the present disclosure. FIG. 13A is an operation of disposing a cover layer 103 on a semiconductor package 100. In some embodiments, a seed layer 101 is deposited on the semiconductor package 100 prior to the disposition of the cover layer 103. In some embodiments, a through opening 105 having a width A1 is formed in the cover layer 103 through a patterning operation.

Figure 13B:
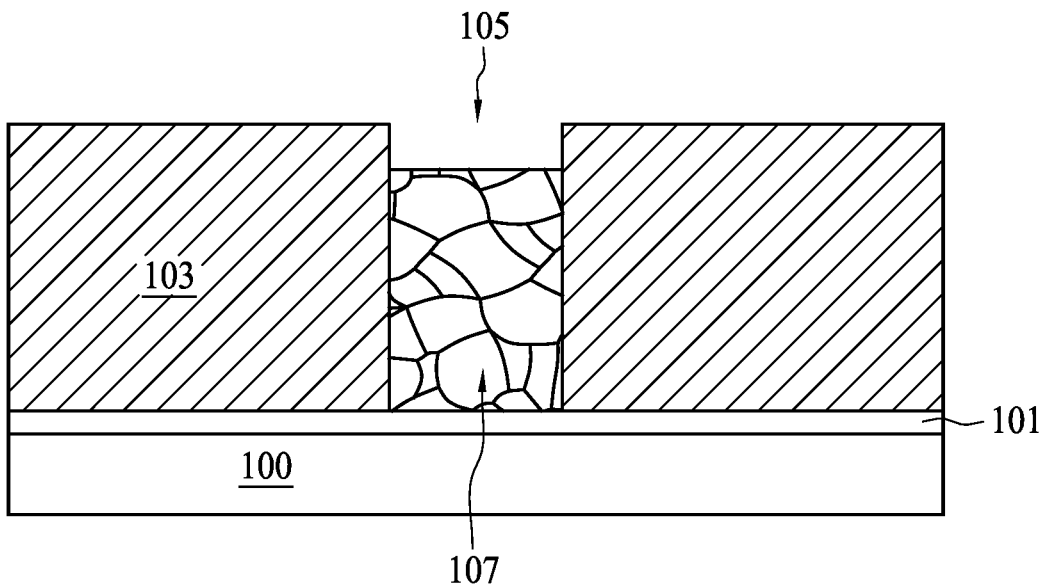

FIG. 13B is an operation of filling a first conductive material 107 into the through opening 105 in the cover layer 103 by a first operation. In some embodiments, the first conductive material 107 is conductive copper. However, other conductive materials can be used and are within the contemplated scope of the present disclosure. In some embodiments, the first operation is an electroplating operation. The electroplating solution of the first copper electroplating operation contains 0.5M $H_2SO_4$, 0.5M $CuSO_4$, 0.25M brightener, and 0.25M carrier. The electroplating operation is performed at room temperature and at 2.5 A constant current for 1600 seconds.

Figure 13C:
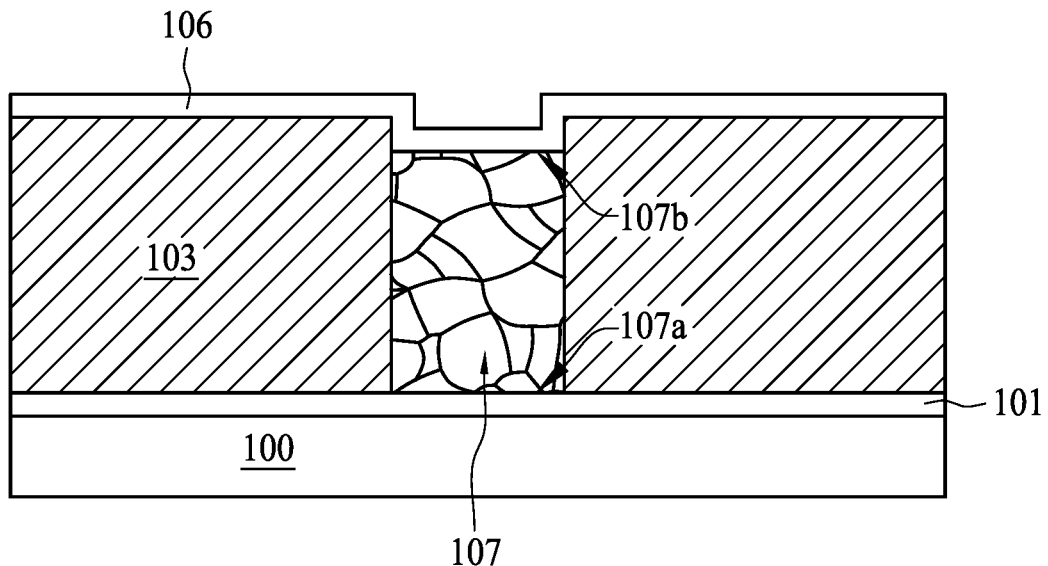

FIG. 13C is an operation of forming a seed layer 106 at an outer surface of the first conductive material 107. In some embodiments, the formation of the seed layer 106 is a sputtering operation. By using a sputtering operation, the seed layer 106 is not only deposited on a second end 107b of the first conductive material 107, but also the top surface of the cover layer 103. However, other deposition methods, for example, electroplating, electroless plating, or atomic layer deposition (ALD), permitting the seed layer 106 with a desired surface roughness to be formed, are within the contemplated scope of the present disclosure.

Figure 13D:
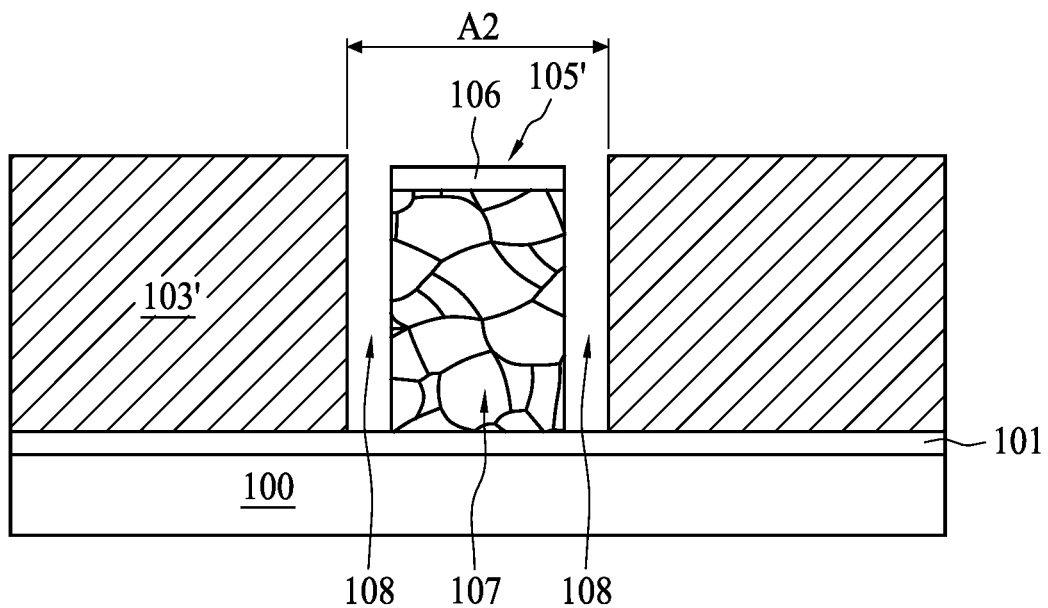

FIG. 13D is an operation of forming a mask layer 103' around the first conductive material 107. In some embodiments, the mask layer 103' is obtained by removing the cover layer 103 shown in FIG. 13C and reforming a mask layer 103' having a through opening 105' (with a width of A2) as shown in FIG. 13D. The portion of the seed layer 106 positioned on cover layer 103 is lift off along with the cover layer 103 removal operation. The through opening 105' in the mask layer 103' has a width of A2 that is greater than the width of A1 shown in FIGS. 13A and 13B. Because the dimension of the through opening 105' is larger than the through opening 105, a gap 108 is formed between the mask layer 103' and a sidewall 107s of the first conductive material 107.

Figure 13E:
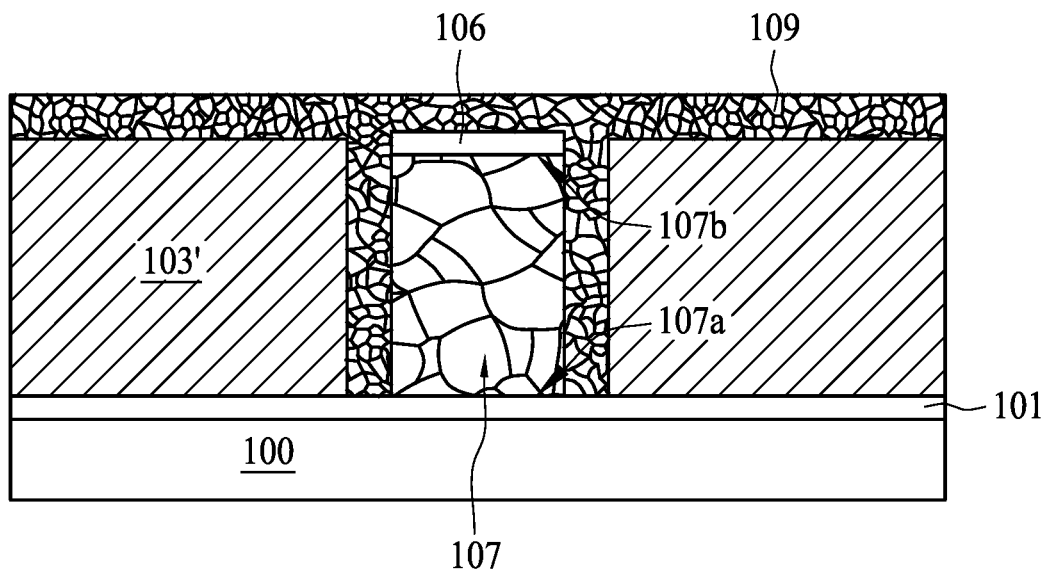

FIG. 13E is an operation of forming a second conductive material 109 on an outer surface of the first conductive material 107 by a second operation. As shown in FIG. 13E, the outer surface includes a second end 107b (as opposed to a first end 107a) and a sidewall 107S of the first conductive material 107. In some embodiments, the second conductive material 109 is conductive copper. In some embodiments, the second operation is a sputtering operation.

In certain embodiments, the sputtering operation is carried out at a deposition temperature of 100° C., 200 W working power, a deposition rate of approximately 1.2 nm/s. The sample being sputtered is place under an ultra high vacuum (~4×10$^{-8}$ Pa base pressure) in a load-lock system. The argon ion acceleration voltage is 2 kV and the working gas (Argon) pressure is about 1.5×10$^{-4}$ Pa. The sputtered second conductive materials 109 forms a blanket layer on both the top surface of the first conductive material 107 and the top surface of the mask layer 103'. In some embodiments, the second conductive materials 109 substantially fill the gaps 108 between the sidewall 107S of the first conductive material 107 and the mask layer 103'. In some embodiments, the second conductive materials 109 partially fill the gaps 108.

Figure 13F:
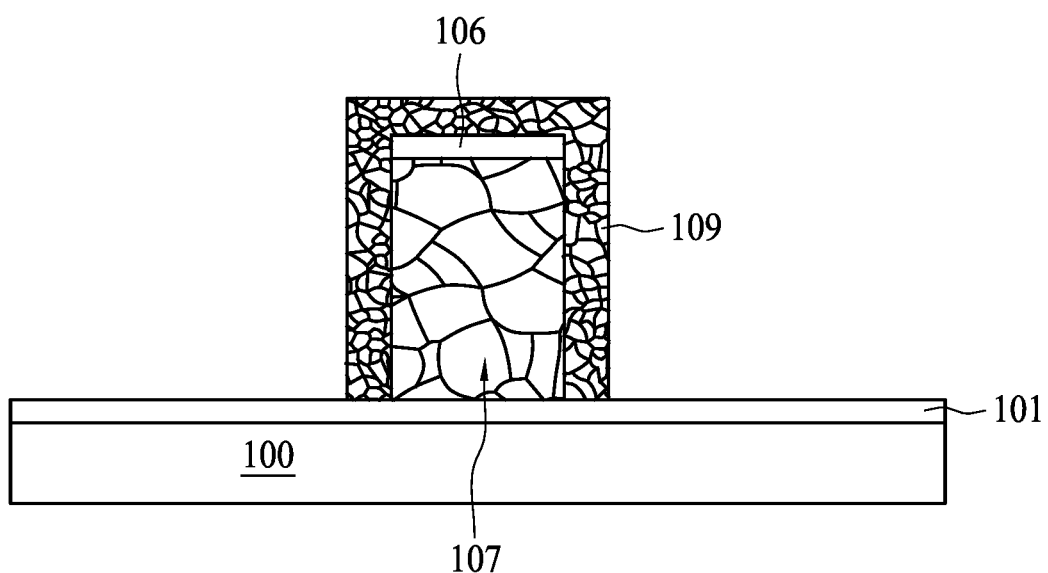

In FIG. 13F, the mask layer 103' is subsequently removed and the portion of the second conductive layer 109 residing on the mask layer 103' is concurrently lift off. In some embodiments, the first conductive material 107 corresponds to the conductive body 101, and the second conductive material 109 corresponds to the conductive layer 102 with reference to FIG. 1.

In some embodiments, two interconnect structures as shown in FIG. 13F are further aligned using a flip chip bonder to form an interconnect structure in a 3D stacked packaging arrangement 60 with reference to the interconnect structure 620 of FIG. 6. A temperature of from 150° C. to 350° C., a pressure of from 10 MPa to 100 MPa, and a duration of from 10 s to 100 s are applied to the surfaces of the second conductive material 109 to be bonded. In some embodiments, the average grain size (a) of the electroplated copper after the bonding operation is of from 500 nm to 2500 nm; and the average grain size (b) of the electroless-plated copper after the bonding operation is of from 200 nm to 500 nm. As a result, the difference between the average grain size (a) and the average grain size (b) is over 100 nm in said embodiments.

The present disclosure provides a conductive interconnect structure. The interconnect structure comprises a contact pad; a conductive body with a longitudinal direction perpendicular to a surface of the contact pad connected to the first contact pad at a first end, the conductive body comprising an average grain size (a) on a cross sectional plane whose normal is perpendicular to the longitudinal direction of the conductive body; and a conductive layer comprising an average grain size (b) on the cross sectional plane positioned on a second end of the conductive body that is opposite to the first end; wherein the conductive body and the conductive layer are composed of same material, and wherein the average grain size (a) is greater than the average grain size (b).

The present disclosure provides a semiconductor package. The semiconductor package comprises a first semiconductor package with a first surface, wherein a first contact pad is on the first surface; a second semiconductor package with a second surface, wherein a second contact pad is on the second surface; and a conductive interconnect structure electrically coupled to the first contact pad and the second contact pad. The conductive interconnect structure comprises a first conductive body with a longitudinal direction perpendicular to a surface of the first contact pad connected to the first contact pad at a first end, and the first conductive body comprising an average grain size (a) on a cross sectional plane whose normal is perpendicular to the longitudinal direction of the first conductive body; and a conductive layer comprising an average grain size (b) on the cross sectional plane positioned on a second end of the first conductive body that is opposite to the first end; wherein the first conductive body and the conductive layer are composed of same materials, and wherein the average grain size (a) is greater than the average grain size (b).

The present disclosure provides a method of manufacturing a conductive interconnect structure. The method comprises (1) disposing a cover layer on a semiconductor package; (2) forming a through opening in the cover layer; (3) filling a first conductive material into the through opening by a first operation, wherein the first operation is configured to generate an average grain size (a) of the first conductive material; and (4) forming a second conductive material on an outer surface of the first conductive material by a second operation, wherein the second operation is configured to generate an average grain size (b) of the second conductive material; wherein the average grain size (a) is greater than the average grain size (b), and wherein the first conductive material and the second conductive material are substantially the same.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a conductive interconnect structure, comprising:
   disposing a cover layer on a semiconductor package;
   forming a through opening in the cover layer;
   filling a first conductive material into the through opening by a first electroplating operation under a first plating current, wherein the first electroplating operation is configured to generate an average grain size (a) of the first conductive material;
   forming a mask layer around the first conductive material with a gap between the mask layer and a sidewall surface of the first conductive material; and
   forming a second conductive material on an outer surface of the first conductive material by a second electroplating operation under a second plating current, wherein the first plating current is different from the second plating current, and wherein the second electroplating operation is configured to generate an average grain size (b) of the second conductive material,
wherein the average grain size (a) is greater than the average grain size (b), the average grain size (a) is of from 500 nm to 2500 nm, the grain size (b) is of from 200 nm to 500 nm, and wherein the first conductive material and the second conductive material are substantially the same.

2. The method in claim 1, wherein the second conductive material is further formed on the sidewall surface of the first conductive material through the gap between the mask layer and the sidewall surface of the first conductive material.

3. The method in claim 1, wherein the forming the mask layer around the first conductive material with the gap between the mask layer and the sidewall surface of the first conductive material comprises removing a portion of the cover layer to form the mask layer having a second through opening wider than the through opening of the cover layer.

4. The method in claim 1, further comprising forming a seed layer on the outer surface of the first conductive material before the formation of the second conductive material.

5. The method in claim 1, wherein the first electroplating operation and the second electroplating operation are performed under a same temperature.

6. The method in claim 1, wherein the first plating current is lower than the second plating current.

7. A method of manufacturing a conductive interconnect structure, comprising:
disposing a first cover layer on a semiconductor package;
forming a through opening in the first cover layer;
filling a first conductive material into the through opening by a first electroplating operation under a first plating current;
forming a second cover layer on the semiconductor package exposing an entire sidewall surface of the first conductive material subsequent to filling the first conductive material; and
forming a second conductive material in contact with an outer surface and the entire sidewall surface of the first conductive material by a second electroplating operation under a second plating current, wherein the first plating current is different from the second plating current;
wherein an average grain size (a) of the first conductive material is greater than an average grain size (b) of the second conductive material, the average grain size (a) is of from 500 nm to 2500 nm, and the grain size (b) is of from 200 nm to 500 nm.

8. The method in claim 7, further comprising forming the seed layer on the sidewall surface of the first conductive material before the formation of the second conductive material.

9. The method in claim 7, wherein forming the second cover layer comprises forming a mask layer around the first conductive material with a gap between the mask layer and the sidewall surface of the first conductive material.

10. The method in claim 7, wherein first electroplating operation and the second electroplating operation are performed under a same temperature.

11. The method in claim 7, wherein the first plating current is lower than the second plating current.

12. A method of manufacturing a conductive interconnect structure, comprising:
disposing a first cover layer on a semiconductor package;
forming a through opening in the first cover layer;
filling a first conductive material into the through opening by a first electroplating operation under a first plating current thereby forming a first conductive body having an average grain size (a);
forming a second cover layer on the semiconductor package exposing an entire sidewall surface of the first conductive body subsequent to filling the first conductive material;
forming a first conductive layer in contact with a top end and the entire sidewall surface of the first conductive body by a second electroplating operation under a second plating current, wherein the first plating current is different from the second plating current;
forming a second conductive body having an average grain size (c);
forming a second conductive layer over a top end of the second conductive body; and
connecting the first conductive body and the second conductive body via bonding the first conductive layer and the second conductive layer,
wherein the first conductive layer comprises an average grain size (b), the average grain size (a) is greater than the average grain size (b), the average grain size (a) is of from 500 nm to 2500 nm, and the grain size (b) is of from 200 nm to 500 nm.

13. The method in claim 12, wherein the average grain size (a) and the average grain size (c) are substantially identical.

14. The method in claim 13, further comprising forming a seed layer between the top end of the first conductive body and the first conductive layer.

15. The method in claim 13, further comprising forming a seed layer between the sidewall surface of the first conductive body and the first conductive layer.

16. The method in claim 13, further comprising forming a seed layer between the top end of the second conductive body and the second conductive layer.

17. The method in claim 13, further comprising forming the second conductive layer on a sidewall surface of the second conductive body.

18. The method in claim 17, further comprising forming a seed layer between the sidewall surface of the second conductive body and the second conductive layer.

* * * * *